United States Patent
Tanaka et al.

(10) Patent No.: US 9,482,688 B2
(45) Date of Patent: Nov. 1, 2016

(54) NBT-BT CRYSTAL PIEZOELECTRIC FILM AND PIEZOELECTRIC STACKING STRUCTURE COMPRISING THE SAME

(71) Applicant: Panasonic Corporation, Osaka (JP)

(72) Inventors: Yoshiaki Tanaka, Nara (JP); Kazuya Hashimoto, Osaka (JP); Takakiyo Harigai, Osaka (JP); Hideaki Adachi, Osaka (JP); Eiji Fujii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 72 days.

(21) Appl. No.: 14/322,780

(22) Filed: Jul. 2, 2014

(65) Prior Publication Data
US 2015/0243878 A1  Aug. 27, 2015

(30) Foreign Application Priority Data

Feb. 26, 2014 (JP) ................... 2014-034994

(51) Int. Cl.
*H01L 41/187* (2006.01)
*B32B 9/00* (2006.01)
(Continued)

(52) U.S. Cl.
CPC ............... *G01P 9/04* (2013.01); *C23C 14/088* (2013.01); *H01L 41/0926* (2013.01); *H01L 41/1873* (2013.01); *H01L 41/1878* (2013.01); *G01C 19/5607* (2013.01)

(58) Field of Classification Search
None
See application file for complete search history.

(56) References Cited

U.S. PATENT DOCUMENTS

| 7,870,787 B2 | 1/2011 | Harigai et al. |
| 7,965,021 B2 | 6/2011 | Harigai et al. |

(Continued)

FOREIGN PATENT DOCUMENTS

| CN | 101981718 | 6/2013 |
| JP | 2007-071757 | 3/2007 |

(Continued)

OTHER PUBLICATIONS

Fang et al. Ceramics International, 38S, 2012, S83-86.*

(Continued)

*Primary Examiner* — Vera Katz
(74) *Attorney, Agent, or Firm* — McDermott Will & Emery LLP

(57) ABSTRACT

The present invention provides an NBT-BT film having a higher polarization-disappearance temperature. The present invention is a $[(Na,Bi)_{1-x}Ba_x]TiO_3$ crystal piezoelectric film. The $[(Na,Bi)_{1-x}Ba_x]TiO_3$ crystal piezoelectric film has a (001) orientation only. The $[(Na,Bi)_{1-x}Ba_x]TiO_3$ crystal piezoelectric film has a-axis length of not less than 0.390 nanometers and not more than 0.395 nanometers. The $[(Na,Bi)_{1-x}Ba_x]TiO_3$ crystal piezoelectric film has c-axis length of not less than 0.399 nanometers and not more than 0.423 nanometers (where x represents a value of not less than 0 and not more than 1). The $[(Na,Bi)_{1-x}Ba_x]TiO_3$ crystal piezoelectric film has a polarization-disappearance temperature of not less than 389 degrees Celsius.

14 Claims, 18 Drawing Sheets

(51) Int. Cl.
*G01C 19/56* (2012.01)
*G01P 3/02* (2006.01)
*H01L 41/113* (2006.01)
*C23C 14/08* (2006.01)
*H01L 41/09* (2006.01)
*G01C 19/5607* (2012.01)

(56) References Cited

U.S. PATENT DOCUMENTS

| | | |
|---|---|---|
| 8,393,719 B2 | 3/2013 | Harigai et al. |
| 8,511,162 B2 | 8/2013 | Harigai et al. |
| 8,562,113 B2 | 10/2013 | Harigai et al. |
| 2010/0194245 A1* | 8/2010 | Harigai |
| 2011/0143146 A1* | 6/2011 | Harigai |
| 2011/0175012 A1* | 7/2011 | Harigai |
| 2013/0038666 A1 | 2/2013 | Harigai et al. |
| 2013/0328974 A1 | 12/2013 | Tanaka et al. |
| 2014/0036004 A1 | 2/2014 | Tanaka et al. |

FOREIGN PATENT DOCUMENTS

| | | |
|---|---|---|
| WO | 2010/047049 | 4/2010 |
| WO | 2010/084711 | 7/2010 |
| WO | 2011/129072 | 10/2011 |
| WO | 2011/158490 | 12/2011 |
| WO | 2012/001942 | 1/2012 |
| WO | 2012/026107 | 3/2012 |
| WO | 2013/114794 | 8/2013 |
| WO | 2014/020799 | 2/2014 |

OTHER PUBLICATIONS

Ye-Jing Dai et al. "Piezoelectric and Ferroelectric Properties of Li-Doped $(Bi_{0.5}Na_{0.5})TiO_3$—$(Bi_{0.5}K_{0.5})TiO_3$—$BaTiO_3$ Lead-Free Piezoelectric Ceramics" Journal of the American Ceramic Society, vol. 93 [4], 2010, pp. 1108-1113.

* cited by examiner

NBT-BT CRYSTAL PIEZOELECTRIC FILM AND PIEZOELECTRIC STACKING STRUCTURE COMPRISING THE SAME

BACKGROUND

1. Field of the Invention

The present invention relates to an NBT-BT crystal piezoelectric film and a piezoelectric stacking structure comprising the same.

2. Description of the Related Art

Perovskite composite oxide $[(Na, Bi)_{1-x}Ba_x]TiO_3$ (hereinafter, referred to as "NBT-BT") has been recently researched and developed as a non-lead (lead-free) ferroelectric material.

US Pre-Grant Patent Application Publication No. 20130328974A1 discloses an NBT-BT film having a high polarization-disappearance temperature Td. Specifically, US Pre-Grant Patent Application Publication No. 20130328974A1 discloses that a $(1-\alpha)$ $(Na, Bi, Ba)TiO_3$-$\alpha BiQO_3$ (Q=Fe, Co, $Zn_{0.5}Ti_{0.5}$, or $Mg_{0.5}Ti_{0.5}$) layer formed on an $Na_xLa_{1-x+y}Ni_{1-y}O_3$ layer by an RF magnetron sputtering under a temperature of 650 degrees Celsius has a polarization-disappearance temperature Td of approximately 180 degrees Celsius to 250 degrees Celsius. The $(1-\alpha)$ $(Na, Bi, Ba)TiO_3$-$\alpha BiQO_3$ layer has a (001) orientation only. The $Na_xLa_{1-x+y}Ni_{1-y}O_{3-x}$ layer is formed on a Pt film having orientation (111) by an RF magnetron sputtering under a temperature of 300 degrees Celsius.

U.S. Pat. No. 7,965,021, U.S. Pat. No. 8,562,113, and U.S. Pat. No. 8,511,162 disclose an NBT-BT film having a (001) orientation only. The NBT-BT film disclosed in these documents is formed on a $LaNiO_3$ layer. The $LaNiO_3$ layer is formed by an RF magnetron sputtering under a temperature of 300 degrees Celsius. It is well known that a $LaNiO_3$ layer has an intense (001) orientation.

U.S. Pat. No. 8,393,719 also discloses an NBT-BT film having a (001) orientation only. The NBT-BT film disclosed in U.S. Pat. No. 8,393,719 is formed on an $Na_xLa_{1-x}NiO_3$ ($0.01 \leq x \leq 0.1$) layer. Similarly to the disclosures of U.S. Pat. No. 7,965,021, U.S. Pat. No. 8,562,113, and U.S. Pat. No. 8,511,162, the $Na_xLa_{1-x}NiO_3$ layer is also formed by an RF magnetron sputtering under a temperature of 300 degrees Celsius. The $Na_xLa_{1-x}NiO_3$ layer also has an intense (001) orientation.

US Pre-Grant Patent Application Publication No. 20130038666A1 also discloses an NBT-BT film having a (001) orientation only. The NBT-BT film disclosed in US Pre-Grant Patent Application Publication No. 20130038666A1 is formed on a Pt layer having a (100) orientation. The Pt layer is formed on a surface of an MgO monocrystalline substrate having a (100) orientation. None of these documents discloses a polarization-disappearance temperature Td.

Journal of the American Ceramic Society 93 [4] (2010) 1108-1113 discloses a method for measuring a polarization-disappearance temperature Td.

SUMMARY

The present invention is a $[(Na,Bi)_{1-x}Ba_x]TiO_3$ crystal piezoelectric film (15), wherein the $[(Na,Bi)_{1-x}Ba_x]TiO_3$ crystal piezoelectric film has a (001) orientation only;

the $[(Na,Bi)_{1-x}Ba_x]TiO_3$ crystal piezoelectric film has a-axis length of not less than 0.390 nanometers and not more than 0.395 nanometers;

the $[(Na,Bi)_{1-x}Ba_x]TiO_3$ crystal piezoelectric film has c-axis length of not less than 0.399 nanometers and not more than 0.423 nanometers;

x represents a value of not less than 0 and not more than 1; and the $[(Na,Bi)_{1-x}Ba_x]TiO_3$ crystal piezoelectric film has a polarization-disappearance temperature of not less than 389 degrees Celsius.

The spirits of the present invention include an ink jet head, an angular velocity sensor, and a piezoelectric generating element using such a $[(Na,Bi)_{1-x}Ba_x]TiO_3$ crystal piezoelectric film (15).

The present invention provides an NBT-BT film having a higher polarization-disappearance temperature.

DETAILED DESCRIPTION OF THE EMBODIMENTS

The embodiments of the present invention are described below with reference to the drawings.

(Definition of Term)

The term used in the instant specification is defined as below.

The term "linearity" means linearity between an applied electric field and an amount of displacement. It is desirable that the linearity is high. The phrase "linearity is high" means that the amount of displacement is proportional to the applied electric field.

The term "applied electric field" means an electric field applied to a piezoelectric layer.

The term "amount of displacement" means the displacement amount of the piezoelectric layer generated by the applied electric field.

The relationship between the amount of the displacement and the applied electric field is described below.

For the angular velocity sensor capable of measuring an exact angular velocity, for the ink jet head capable of ejecting an exact amount of an ink, and for the piezoelectric generation element capable of generating electric power due to positive piezoelectric effect, the amount of the displacement is required to be proportional to the electric field. In other words, the amount b of the displacement and the electric field a are required to satisfy the following equation (1).

$$b=c_1 a \qquad \text{Equation (1) ($c_1$ is constant)}$$

The term "proportion" in the present specification means that the values of a and b satisfy the above-mentioned equation (1). In other words, the term "proportion" means a linear function. The term "proportion" does not include a quadratic function.

Figure 5A:
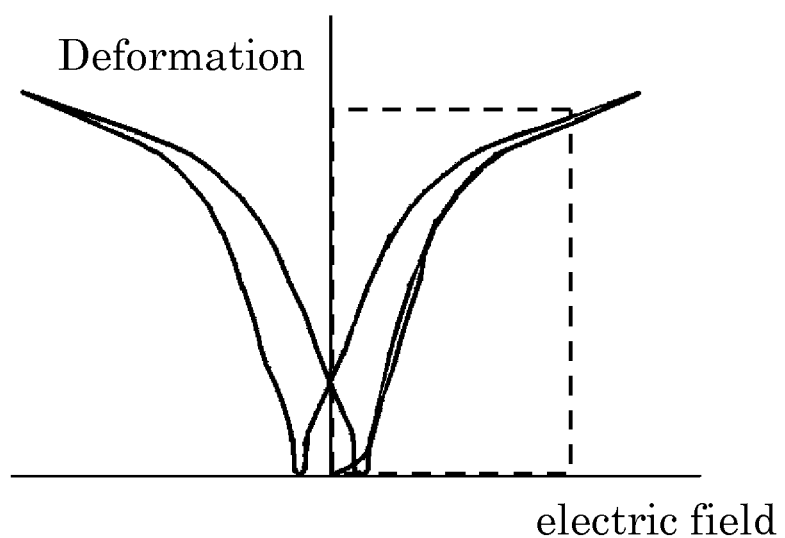
FIG. 5A shows a graph of an electric field—an amount of displacement property of a conventional piezoelectric material.
Figure 5B:
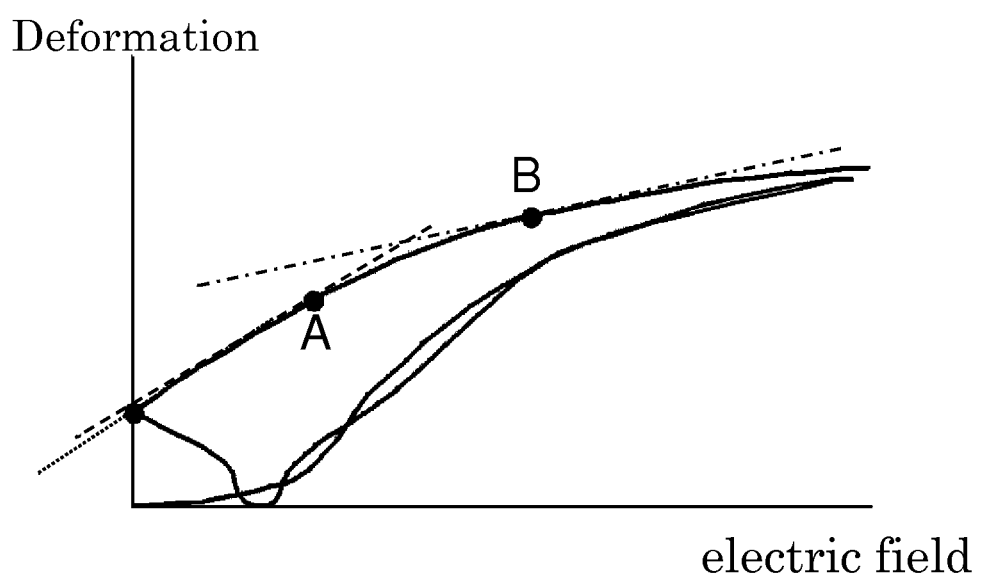
FIG. 5B shows a partially enlarged view of FIG. 5A.

FIG. 5A shows a graph of an electric field—an amount of displacement property of a conventional piezoelectric material. FIG. 5B shows a partially enlarged view of FIG. 5A.

As shown in FIG. 5B, the inclination of the tangent line at the dot A is substantially equal to the inclination of the tangent line at the dot B. The phrase "substantially equal" means that the ratio represented by the formula: (the inclination of the tangent line at the dot A)/(the inclination of the tangent line at the dot B) is not less than 0.8 and not more than 1.2. This means that the amount b of the displacement is proportional to the electric field a. The applied electric fields at the dot A and at the dot B are, for example, 0.3 V/μm and 1.8 V/μm, respectively.

On the other hand, the tangent line at the dot C has a smaller inclination than the tangent lines at the dot A and at the dot B.

When the amount b of the displacement and the electric field a has a relationship of a non-linear function, it is difficult to measure an exact angular velocity, to eject an exact amount of an ink, and to generate an electric power due to positive piezoelectric effect. The relationship of the non-linear function between the amount b of the displacement and the electric field a is not suitable for the angular velocity sensor capable of measuring an exact angular velocity, for the ink jet head capable of ejecting an exact amount of an ink, and for the piezoelectric generation element capable of generating electric power due to positive piezoelectric effect.

The term "polarization-disappearance temperature Td" means the temperature at the time point when a polarization included in the piezoelectric layer disappears completely by heating the piezoelectric layer. In other words, the piezoelectric layer completely loses its polarization in a temperature higher than the polarization-disappearance temperature Td. The piezoelectric layer which does not have the polarization fails to serve as a piezoelectric layer. In view of the solder reflow, it is desirable that the polarization-disappearance temperature Td is not less than 180 degrees Celsius. It is more desirable that the polarization-disappearance temperature Td is not less than 380 degrees Celsius.

Figure 2:
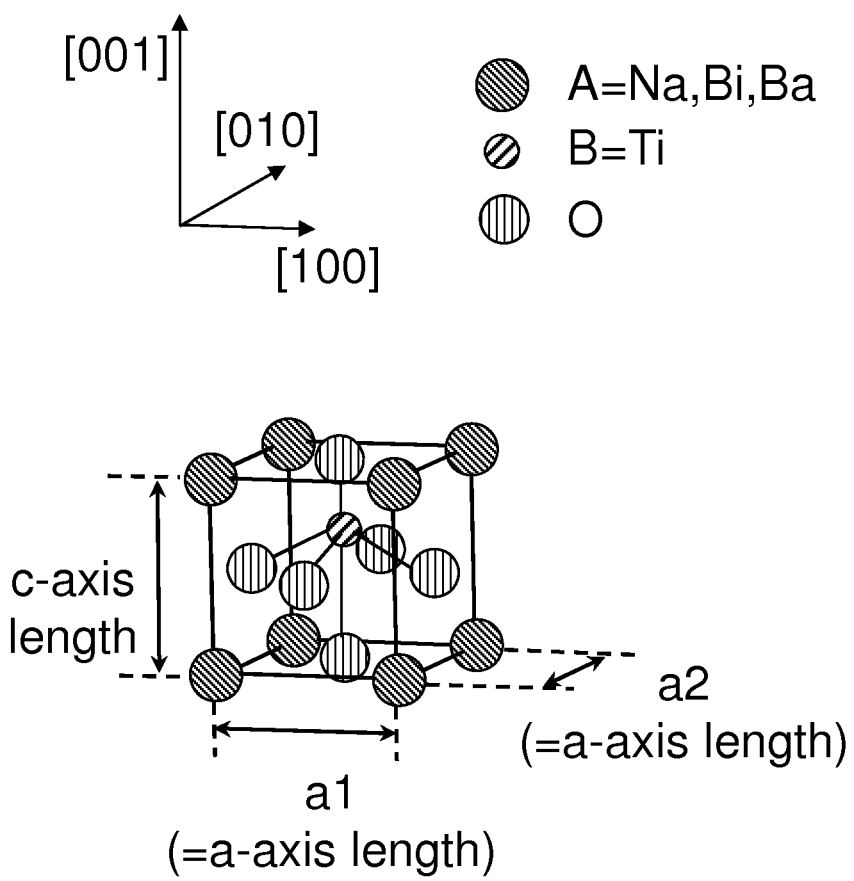
FIG. 2 shows a $[(Na,Bi)_{1-x}Ba_x]TiO_3$ crystal composed of a perovskite crystal lattice represented by a chemical formula $ABO_3$.

The term "a-axis length" means a distance between two adjacent A atoms located along a [100] direction in an $ABO_3$ crystal lattice, as shown in FIG. 2. In other words, the term "a-axis length" means a length of the lattice along the [100] direction in the $ABO_3$ crystal lattice. The distance between two adjacent A atoms located along a [100] direction, namely, the a-axis length, is identical to the distance between two adjacent A atoms located along a [010] direction.

The term "c-axis length" means a distance between two adjacent A atoms located along a [001] direction in an $ABO_3$ crystal lattice, as shown in FIG. 2. In other words, the term "c-axis length" means a length of the lattice along the [001] direction in the $ABO_3$ crystal lattice.

(Piezoelectric Stacking Structure)

Figure 1A:
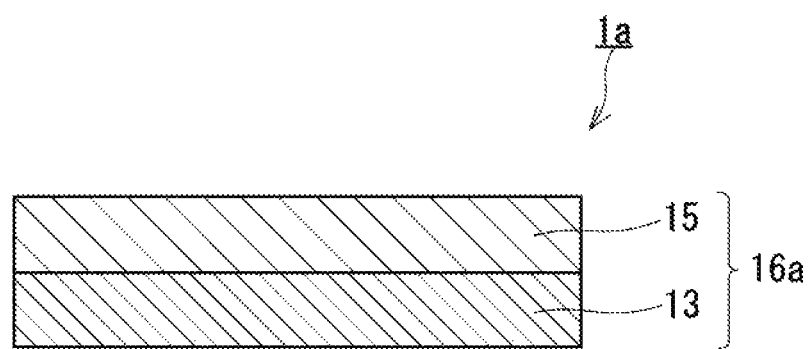
FIG. 1A shows a cross-sectional view of the piezoelectric stacking structure according to the present embodiment.

FIG. 1A shows a cross-sectional view of the piezoelectric stacking structure according to the present embodiment. The piezoelectric stacking structure according to the present embodiment comprises a $La_{1+y}Ni_{1-y}O_3$ layer 13 and a $[(Na, Bi)_{1-x}Ba_x]TiO_3$ crystal piezoelectric film 15, as shown in FIG. 1A. The $[(Na, Bi)_{1-x}Ba_x]TiO_3$ crystal piezoelectric film 15 is stacked on the $La_{1+y}Ni_{1-y}O_3$ layer 13 in such a manner that the $[(Na, Bi)_{1-x}Ba_x]TiO_3$ crystal piezoelectric film 15 is in contact with the $La_{1+y}Ni_{1-y}O_3$ layer 13.

The $[(Na, Bi)_{1-x}Ba_x]TiO_3$ crystal piezoelectric film 15 according to the present embodiment has a (001) orientation only. In other words, the $[(Na, Bi)_{1-x}Ba_x]TiO_3$ crystal piezoelectric film 15 according to the present embodiment does not substantially have an orientation other than a (001) orientation, such as a (100) orientation, a (010) orientation, a (110) orientation, or a (111) orientation. As such, the $[(Na, Bi)_{1-x}Ba_x]TiO_3$ crystal piezoelectric film 15 according to the present embodiment has an intense (001) orientation.

As shown in FIG. 2, the $[(Na, Bi)_{1-x}Ba_x]TiO_3$ crystal is composed of a perovskite crystal lattice represented by a chemical formula $ABO_3$. The A atom is Na, Bi, or Ba. The B atom is Ti.

The distance a1 represents a distance between two adjacent A atoms along the [100] direction. The distance a2 represents a distance between two adjacent A atoms along the [010] direction. In an $ABO_3$ crystal lattice, the [100] direction is equivalent to the [010] direction. For this reason, the distance a1 is equal to the distance a2. In other words, it is meaningless to distinguish the distance a1 from the distance a2. As is clear from this description, an equality of a-axis length=distance a1=distance a2 is satisfied.

The $[(Na, Bi)_{1-x}Ba_x]TiO_3$ crystal piezoelectric film 15 according to the present embodiment has an a-axis length of not less than 0.390 nanometers and not more than 0.395 nanometers. The a-axis length less than 0.390 nanometers decreases a polarization-disappearance temperature Td significantly. See the comparative example B3, which is described later.

Desirably, the a-axis length is not less than 0.391 nanometers and not more than 0.394 nanometers. The a-axis length less than 0.391 nanometers decreases a piezoelectric constant d31. See the example B2, which is described later. If the value of the piezoelectric constant d31 is decreased, the displacement amount of the piezoelectric film is decreased. The a-axis length more than 0.394 nanometers decreases the piezoelectric constant d31 and the linearity. See the example B3, which is described later.

The $[(Na, Bi)_{1-x}Ba_x]TiO_3$ crystal piezoelectric film 15 according to the present embodiment has a c-axis length of not less than 0.399 nanometers. The c-axis length less than 0.399 nanometers decreases the polarization-disappearance temperature Td significantly. See the comparative examples 1 to 3, which are described later. One example of the upper limit of the c-axis length is 0.423 nanometers.

Desirably, the c-axis length is not more than 0.420 nanometers. The c-axis length more than 0.420 nanometers decreases the piezoelectric constant d31. See the example B1, which is described later.

As is clear from the comparison of the examples with the comparative examples, the $[(Na, Bi)_{1-x}Ba_x]TiO_3$ crystal piezoelectric film 15 has a higher polarization-disappearance temperature Td of not less than 389 degrees Celsius, if the a-axis length is not less than 0.390 nanometers and not more than 0.395 nanometers and the c-axis length is not less than 0.399 nanometers and not more than 0.423 nanometers. One example of the upper limit of the polarization-disappearance temperature Td is 470 degrees Celsius.

The value of x is not less than 0 and not more than 1. Desirably, x is not less than 0.00 and not more than 0.22. More desirably, x is not less than 0.02 and not more than 0.20. If x is less than 0.02, the piezoelectric constant d31 and the linearity are decreased. See the example B4, which is described later. Similarly, if x is more than 0.20, the piezoelectric constant d31 and the linearity are decreased. See the example B5, which is described later.

As is clear from the comparison of the examples A1 to A13 with the examples B1 to B13, the $[(Na, Bi)_{1-x}Ba_x]TiO_3$ crystal piezoelectric film 15 has not only a higher polarization-disappearance temperature Td but also a higher piezoelectric constant and a higher linearity, if the a-axis length is not less than 0.391 nanometers and not more than 0.394 nanometers and the c-axis length is not less than 0.399 nanometers and not more than 0.420 nanometers, and x is not less than 0.02 and not more than 0.20. Specifically, such a $[(Na, Bi)_{1-x}Ba_x]TiO_3$ crystal piezoelectric film 15 has the following piezoelectric constants and linearity.

|Piezoelectric constant $d31(0.3$ volts/micrometer)|≥78     (I)

|Piezoelectric constant $d31(1.8$ volts/micrometer)|≥78     (II)

$0.98 ≤$(Piezoelectric constant $d31(0.3$ volts/micrometer)/Piezoelectric constant $d31(1.8$ volts/micrometer)$≤ 1.00$     (III)

The $[(Na, Bi)_{1-x}Ba_x]TiO_3$ crystal piezoelectric film 15 according to the present embodiment may contain a minute amount of impurities. The impurities typically may be Li and K to substitute for Na, and Sr and Ca to substitute for Ba. The impurity typically may be Zr to substitute for Ti. Examples of the other impurities may include Mn, Co, Al, Ga, Nb, and Ta. Some of these impurities can improve the crystallinity and piezoelectric performance of the $[(Na, Bi)_{1-x}Ba_x]TiO_3$ crystal piezoelectric film 15.

Figure 1B:
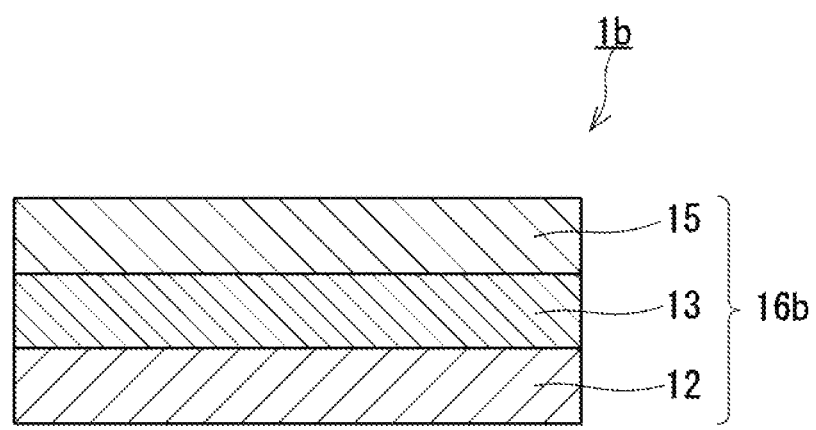
FIG. 1B shows another embodiment of the piezoelectric stacking structure shown in FIG. 1A.

FIG. 1B shows another embodiment of the piezoelectric stacking structure shown in FIG. 1A. A piezoelectric stacking structure 1b shown in FIG. 1B has a multilayer structure 16b. The multilayer structure 16b is a structure in which a metal electrode layer 12 is added to a multilayer structure 16a shown in FIG. 1A. In the multilayer structure 16b, the $La_{1+y}Ni_{1-y}O_3$ layer 13 is formed on this metal electrode layer 12. In Particular, the multilayer structure 16b has the metal electrode layer 12, the $La_{1+y}Ni_{1-y}O_3$ layer 13, and the $[(Na, Bi)_{1-x}Ba_x]TiO_3$ crystal piezoelectric film 15, in this order.

An example of the material for the metal electrode layer 12 is a metal such as platinum, palladium, or gold; or a conductive oxide such as nickel oxide, ruthenium oxide, iridium oxide, or strontium ruthenate. The metal electrode layer 12 can be made of two or more these materials. Preferably, the metal electrode layer 12 has a low electrical resistance and a high heat resistance. Therefore, it is preferred that the metal electrode layer 12 is a platinum layer. The Pt layer may have a (111) orientation.

In other words, the piezoelectric film according to the present embodiment may further comprise a platinum layer. The $La_{1+y}Ni_{1-y}O_3$ layer 13 may be formed on the platinum layer.

The metal electrode layer 12 can serve as an electrode layer to apply a voltage to the $[(Na, Bi)_{1-x}Ba_x]TiO_3$ crystal piezoelectric film 15 together with the $La_{1+y}Ni_{1-y}O_3$ layer 13. In other words, the electrode layer is a laminate composed of the $La_{1+y}Ni_{1-y}O_3$ layer 13 and the metal electrode layer 12.

The piezoelectric stacking structure 1b shown in FIG. 1B can be manufactured by forming the $La_{1+y}Ni_{1-y}O_3$ layer 13, and the $[(Na, Bi)_{1-x}Ba_x]TiO_3$ crystal piezoelectric film 15 on the metal electrode layer 12 in this order.

Figure 1C:
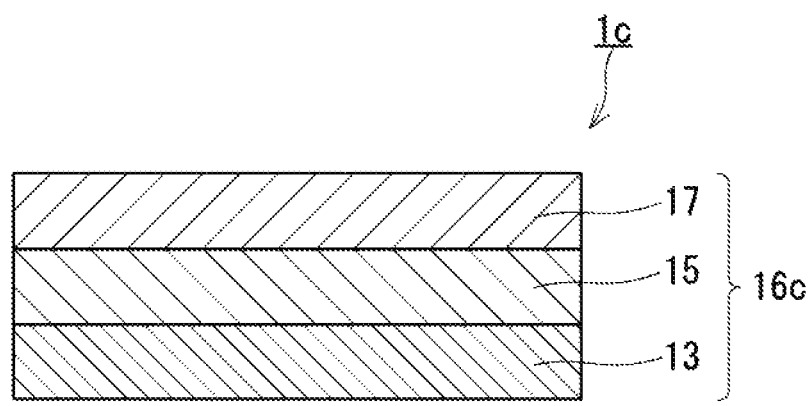
FIG. 1C shows still another embodiment of the piezoelectric stacking structure shown in FIG. 1A.

FIG. 1C shows still another embodiment of the piezoelectric stacking structure shown in FIG. 1A. A piezoelectric stacking structure 1c shown in FIG. 1C has a multilayer structure 16c. The multilayer structure 16c is a structure in which a conductive layer 17 is added to the multilayer structure 16a shown in FIG. 1A. The conductive layer 17 is formed on the $[(Na, Bi)_{1-x}Ba_x]TiO_3$ crystal piezoelectric film 15. In Particular, the multilayer structure 16c has the $La_{1+y}Ni_{1-y}O_3$ layer 13, the $[(Na, Bi)_{1-x}Ba_x]TiO_3$ crystal piezoelectric film 15, and the conductive layer 17 in this order.

In the piezoelectric stacking structure 1c, the $[(Na, Bi)_{1-x}Ba_x]TiO_3$ crystal piezoelectric film 15 is interposed between the $La_{1+y}Ni_{1-y}O_3$ layer 13 and the conductive layer 17. The $La_{1+y}Ni_{1-y}O_3$ layer 13 and the conductive layer 17 can serve as a first electrode layer and a second electrode layer, respectively, to apply a voltage to the $[(Na, Bi)_{1-x}Ba_x]TiO_3$ crystal piezoelectric film 15.

The conductive layer 17 is made of a conductive material. An example of the material is a metal having a low electrical resistance. The material may be a conductive oxide such as NiO, $RuO_2$, $IrO_3$, $SrRuO_3$, or $LaNiO_3$. The conductive layer 17 may be composed of two or more these materials. A metal layer may be provided between the conductive layer 17 and the $[(Na, Bi)_{1-x}Ba_x]TiO_3$ crystal piezoelectric film 15 to improve the adhesion therebetween. An example of the material of the metal layer is titanium. The material may be tantalum, iron, cobalt, nickel, or chrome. The metal layer may be composed of two or more these materials. The metal layer may be omitted depending on the adhesion between the conductive layer 17 and the $[(Na, Bi)_{1-x}Ba_x]TiO_3$ crystal piezoelectric film 15.

The piezoelectric stacking structure 1c shown in FIG. 1C can be manufactured by forming the $[(Na, Bi)_{1-x}Ba_x]TiO_3$ crystal piezoelectric film 15 and the conductive layer 17 on the $La_{1+y}Ni_{1-y}O_3$ layer 13 in this order. The conductive layer 17 can be formed by a thin film formation technique such as sputtering, PLD, CVD, sol-gel processing, or AD.

Figure 1D:
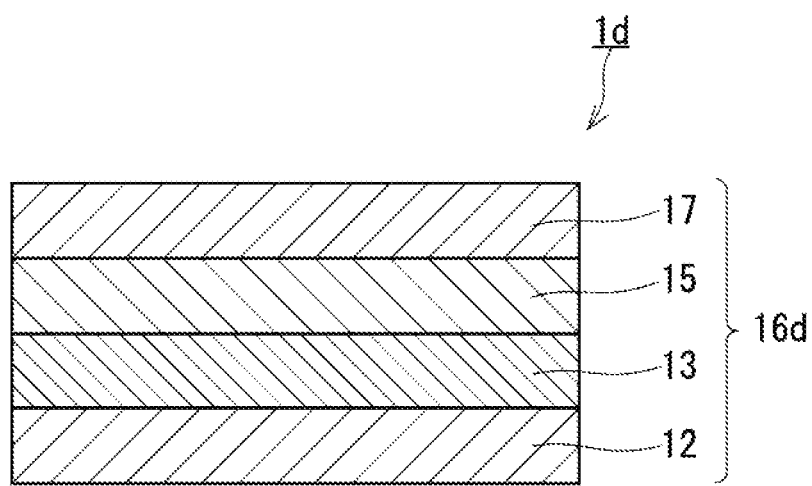
FIG. 1D shows further still another embodiment of the piezoelectric stacking structure shown in FIG. 1A.

FIG. 1D shows further still another embodiment of the piezoelectric stacking structure shown in FIG. 1A. A piezoelectric stacking structure 1d shown in FIG. 1D has a multilayer structure 16d. The multilayer structure 16d is a structure in which the metal electrode layer 12 and the conductive layer 17 are added to the multilayer structure 16a shown in FIG. 1A. In the multilayer structure 16d, the $La_{1+y}Ni_{1-y}O_3$ layer 13 is formed on the metal electrode layer 12. The conductive layer 17 is formed on the $[(Na, Bi)_{1-x}Ba_x]TiO_3$ crystal piezoelectric film 15. Particularly, the multilayer structure 16d has the metal electrode layer 12, the $La_{1+y}Ni_{1-y}O_3$ layer 13, the $[(Na, Bi)_{1-x}Ba_x]TiO_3$ crystal piezoelectric film 15, and the conductive layer 17 in this order.

The metal electrode layer 12 can serve together with the $La_{1+y}Ni_{1-y}O_3$ layer 13 as an electrode layer to apply a voltage to the $[(Na, Bi)_{1-x}Ba_x]TiO_3$ crystal piezoelectric film 15 which is a piezoelectric layer. In other words, the electrode layer is a laminate of the $La_{1+y}Ni_{1-y}O_3$ layer 13 and the metal electrode layer 12. Furthermore, in the piezoelectric stacking structure 1d, the $[(Na, Bi)_{1-x}Ba_x]TiO_3$ crystal piezoelectric film 15 is interposed between the $La_{1+y}Ni_{1-y}O_3$ layer 13 and the conductive layer 17. The $La_{1+y}Ni_{1-y}O_3$ layer 13 and the conductive layer 17 can serve as the first electrode layer and the second electrode layer, respectively, to apply a voltage to the $[(Na, Bi)_{1-x}Ba_x]TiO_3$ crystal piezoelectric film 15.

The piezoelectric stacking structure 1d shown in FIG. 1D can be manufactured by forming the $La_{1+y}Ni_{1-y}O_3$ layer 13, the $[(Na, Bi)_{1-x}Ba_x]TiO_3$ crystal piezoelectric film 15, and the conductive layer 17 on the metal electrode layer 12 in this order.

Figure 1E:
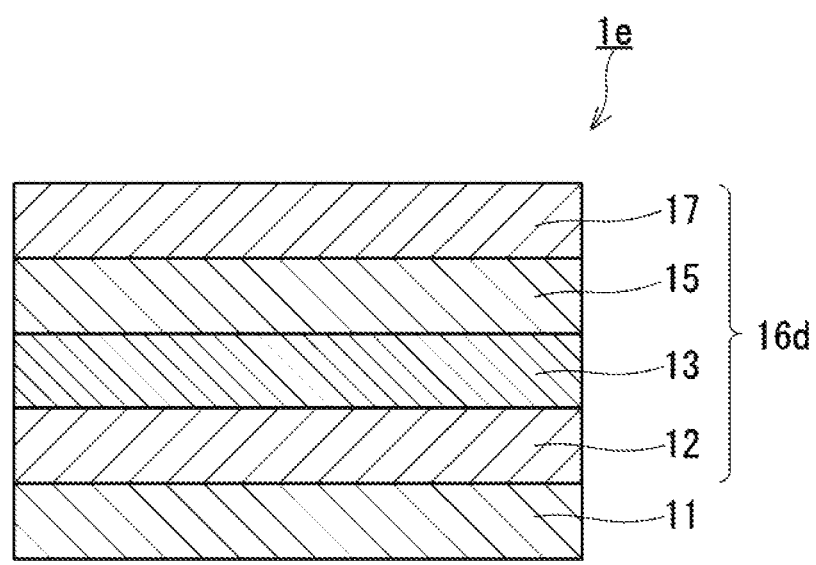
FIG. 1E shows a piezoelectric stacking structure comprising a substrate.

The piezoelectric film 1e may further comprise a substrate 11 as shown in FIG. 1E. The $La_{1+y}Ni_{1-y}O_3$ layer 13 is formed through the metal electrode 12 over the substrate 11.

In the piezoelectric stacking structure 1e shown in FIG. 1E, the multilayer structure 16d shown in FIG. 1D is formed on the substrate 11.

The substrate 11 may be a silicon substrate. A silicon monocrystalline substrate is desirable. An $MgAl_2O_4$ monocrystalline substrate may be used.

A metal layer may be disposed between the substrate 11 and the multilayer structure 16d (more particularly, between the substrate 11 and the $La_{1+y}Ni_{1-y}O_3$ layer 13) to improve the adhesion therebetween. However, the metal layer needs electric conductivity. An example of the material of the metal layer may be Ti, Ta, Fe, Co, Ni, or Cr. Ti is desirable. Two or more materials may be used for the metal layer. The metal layer can be omitted, depending on the adhesion between the substrate 11 and the multilayer structure 16d.

The piezoelectric film 1e shown in FIG. 1E can be fabricated by forming the metal electrode layer 12, the $La_{1+y}Ni_{1-y}O_3$ layer 13, the $[(Na, Bi)_{1-x}Ba_x]TiO_3$ crystal piezoelectric film 15, and the conductive layer 17 on the substrate 11 in this order.

(Fabrication Method)

The $[(Na, Bi)_{1-x}Ba_x]TiO_3$ crystal piezoelectric film 15 according to the present embodiment can be fabricated by the following first or second method.

In the first method, as shown in FIG. 1A, the $La_{1+y}Ni_{1-y}O_3$ layer 13 is used. In other words, the $[(Na, Bi)_{1-x}Ba_x]TiO_3$ crystal piezoelectric film 15 is formed on the $La_{1+y}Ni_{1-y}O_3$ layer 13. See the examples A1-A12 and the examples B1 B5, which are described later.

It is known that a $La_{1+y}Ni_{1-y}O_3$ layer 13 has an intense (001) orientation regardless of the orientation of a layer which is in contact with and located below the $La_{1+y}Ni_{1-y}O_3$ layer 13. For this reason, the $[(Na, Bi)_{1-x}Ba_x]TiO_3$ crystal piezoelectric film 15 formed on the $La_{1+y}Ni_{1-y}O_3$ layer 13 also has an intense (001) orientation.

The $[(Na, Bi)_{1-x}Ba_x]TiO_3$ crystal piezoelectric film 15 can be formed on the $La_{1+y}Ni_{1-y}O_3$ layer 13 by an RF sputtering.

The present inventors discovered that the a-axis length of the $[(Na, Bi)_{1-x}Ba_x]TiO_3$ crystal piezoelectric film 15 is increased with an increase in the value of y included in the $La_{1+y}Ni_{1-y}O_3$ layer 13. Furthermore, the present inventors discovered that the c-axis length of the $[(Na, Bi)_{1-x}Ba_x]TiO_3$ crystal piezoelectric film 15 is increased with a decrease in the formation temperature of the $La_{1+y}Ni_{1-y}O_3$ layer 13.

Desirably, the value of y is not less than 0.05 and not more than 0.15. More desirably, the value of y is not less than 0.00 and not more than 0.10. If the value of y is less than 0.00, the piezoelectric constant d31 decreases. See the example B2. If the value of y is more than 0.10, the piezoelectric constant d31 and the linearity decrease. See the example B3.

The formation temperature of the $La_{1+y}Ni_{1-y}O_3$ layer 13 is not more than 275 degrees Celsius. In other words, the $La_{1+y}Ni_{1-y}O_3$ layer 13 is formed under a temperature of not more than 275 degrees Celsius. Desirably, the $La_{1+y}Ni_{1-y}O_3$ layer 13 is formed under a temperature of not less than 200 degrees Celsius and not more than 275 degrees Celsius. More desirably, the $La_{1+y}Ni_{1-y}O_3$ layer 13 is formed under a temperature of not less than 225 degrees Celsius and not more than 275 degrees Celsius. When the $La_{1+y}Ni_{1-y}O_3$ layer 13 is formed under a temperature less than 225 degrees Celsius, the piezoelectric constant d31 may decrease. See the example B1.

US Pre-Grant Patent Application Publication No. 20130328974A1, U.S. Pat. No. 7,965,021, U.S. Pat. No. 8,562,113, U.S. Pat. No. 8,511,162, and U.S. Pat. No. 8,393,719 disclose to form a $La_{1+y}Ni_{1-y}O_3$ layer 13 under a temperature of 300 degrees Celsius to form an NBT-BT film. However, when the $La_{1+y}Ni_{1-y}O_3$ layer 13 is formed under a temperature of 300 degrees Celsius, the polarization-disappearance temperature Td does not improve. In particular, the polarization-disappearance temperature Td is not more than 250 degrees Celsius, when the $La_{1+y}Ni_{1-y}O_3$ layer 13 is formed under a temperature of 300 degrees Celsius. On the other hand, when the $La_{1+y}Ni_{1-y}O_3$ layer 13 is formed under a temperature of not more than 275 degrees Celsius, the polarization-disappearance temperature Td is improved significantly to be not less than 389 degrees Celsius.

In the second method, the $La_{1+y}Ni_{1-y}O_3$ layer 13 is not used. In the second method, the $[(Na, Bi)_{1-x}Ba_x]TiO_3$ crystal piezoelectric film 15 is formed on a Pt layer by an RF sputtering. See the example A13, which is described later. The RF power and the $Ar/O_2$ flow ratio used in the second method are different from those disclosed in US Pre-Grant Patent Application Publication No. 20130038666A1.

As long as the $[(Na, Bi)_{1-x}Ba_x]TiO_3$ crystal piezoelectric film 15 has the same a-axis length and the same c-axis length, the $[(Na, Bi)_{1-x}Ba_x]TiO_3$ crystal piezoelectric film 15 provided by the first method has similar properties to the $[(Na, Bi)_{1-x}Ba_x]TiO_3$ crystal piezoelectric film 15 provided by the second method. Compare the $[(Na, Bi)_{1-x}Ba_x]TiO_3$ crystal piezoelectric film 15 according to the example A1 provided by the first method with the $[(Na, Bi)_{1-x}Ba_x]TiO_3$ crystal piezoelectric film 15 according to the example A13 provided by the second method.

EXAMPLES

The following examples describe the present invention in more detail.

Example A1

In the example A1, a piezoelectric stacking structure shown in FIG. 1E was fabricated. The $[(Na, Bi)_{0.93}Ba_{0.07}]TiO_3$ crystal piezoelectric film 15 included in the piezoelectric stacking structure according to the example A1 had an a-axis length of 0.392 nanometers and a c-axis length of 0.410 nanometers. The piezoelectric stacking structure according to the example A1 was fabricated as below.

A platinum layer having a (111) orientation and a thickness of 100 nanometers was formed on a surface of a silicon monocrystalline substrate having a (100) orientation by an RF magnetron sputtering. This platinum layer served as the metal electrode layer 12.

The condition of the sputtering of the platinum layer is described below.

Target: Metal platinum
Atmosphere: Argon gas
RF power: 15 W
Substrate temperature: 300 degrees Celsius Before the platinum layer is formed, a titanium layer having a thickness of 2.5 nanometers was formed on the surface of the silicon monocrystalline substrate to improve the adhesion between the silicon monocrystalline substrate and the platinum layer. The titanium layer was formed under the sputtering condition similar to the spattering condition for the platinum layer, except that metal titanium was used as a target instead of the metal platinum.

Next, the $La_{1.05}Ni_{0.95}O_3$ layer 13 having a (001) orientation and a thickness of 500 nanometers was formed on the surface of the platinum layer by an RF magnetron sputtering.

The condition of the sputtering for the $La_{1.05}Ni_{0.95}O_3$ layer 13 is described below.

Target: $La_{1+y}Ni_{1-y}O_3$ (y=0.05)
Atmosphere: Gaseous mixture of argon and oxygen (Flow ratio of $Ar/O_2$: 80/20)
RF power: 100 W
Substrate temperature: 250 degrees Celsius The composition of the formed $La_{1+y}Ni_{1-y}O_3$ layer 13 was analyzed by an energy dispersive X-ray spectroscopy (SEM-EDX) and a wavelength dispersive X-ray micro analyzer (WDS). In the composition analysis, it was difficult to quantify a light element accurately, since the analysis accuracy of the light element such as oxygen was low. However, it was confirmed that the composition of La and Ni contained in the formed $La_{1+y}Ni_{1-y}O_3$ layer 13 was identical to the composition of the target.

Next, the $[(Na, Bi)_{0.93}Ba_{0.07}]TiO_3$ crystal piezoelectric film 15 having a thickness of 2.7 micrometers was formed on the surface of the $La_{1.05}Ni_{0.95}O_3$ layer 13 by an RF magnetron sputtering. In this way, the $[(Na, Bi)_{0.93}Ba_{0.07}]TiO_3$ crystal piezoelectric film 15 according to the example A1 was obtained. The formed $[(Na, Bi)_{1-x}Ba_x]TiO_3$ crystal piezoelectric film 15 was subjected to an X-ray diffraction analysis to analyze the crystal structure thereof. The X-ray diffraction analysis was carried out in such a manner that an X-ray beam was made incident from over the $[(Na, Bi)_{1-x}Ba_x]TiO_3$ crystal piezoelectric film 15.

Figure 4:
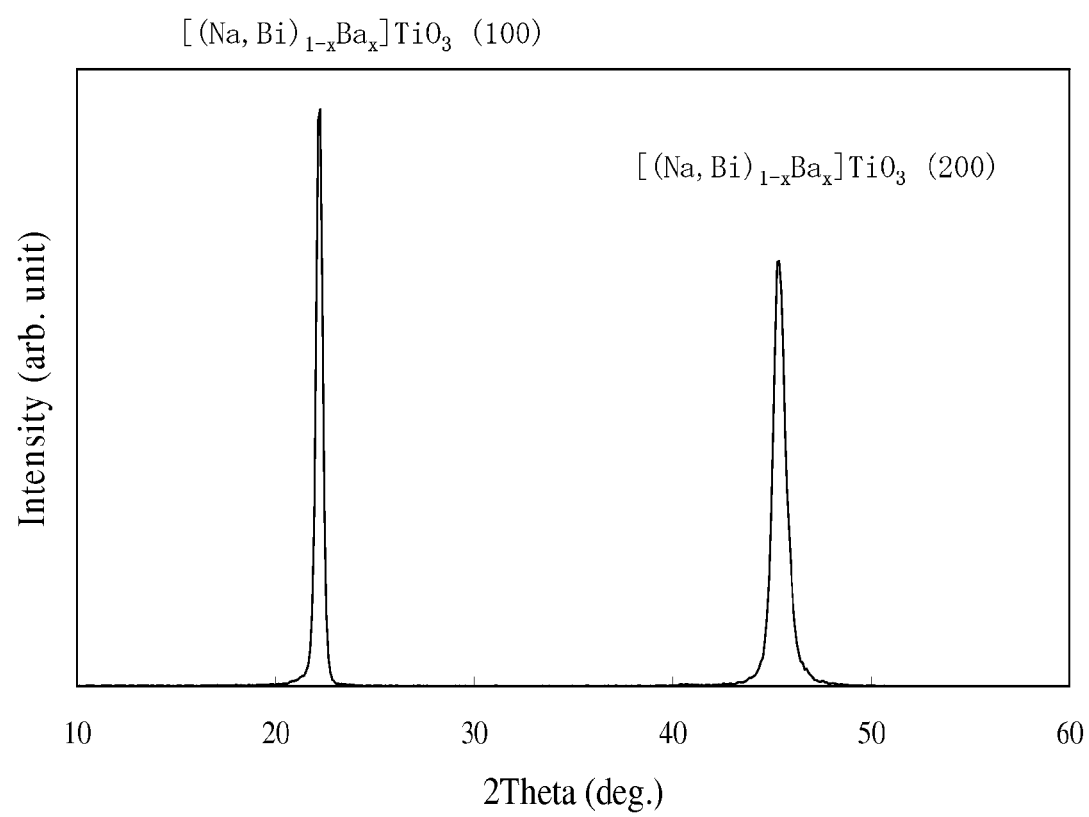
FIG. 4 shows the result of the X-ray diffraction profile according to the example 1.

FIG. 4 shows the result of the X-ray diffraction analysis. Observed was only the reflection peak derived from the $[(Na, Bi)_{1-x}Ba_x]TiO_3$ crystal piezoelectric film 15 having only a (001) orientation. The intensity of the (001) reflection peak was a significantly high value of 16,672 cps. The profile shown in FIG. 4 means that the $[(Na, Bi)_{1-x}Ba_x]TiO_3$ crystal piezoelectric film 15 according to the example A1 has a significantly high (001) orientation. In other words, FIG. 4 means that the $[(Na, Bi)_{1-x}Ba_x]TiO_3$ crystal piezoelectric film 15 according to the example A1 has a (001) orientation only. In the following examples and the comparative examples below, X-ray diffraction analyses were carried out in the same manner. As a result, a significantly high (001) orientation was observed in all the $[(Na, Bi)_{1-x}Ba_x]TiO_3$ crystal piezoelectric films 15 by this X-ray diffraction analysis in the following examples and comparative examples, too.

The condition of the sputtering for the $[(Na, Bi)_{1-x}Ba_x]TiO_3$ crystal piezoelectric film 15 is described below.

Target: $(Na, Bi)_{1-x}TiO_3$—$Ba_xTiO_3$ (x=0.07)
Atmosphere: Gaseous mixture of argon and oxygen (Flow ratio of $Ar/O_2$: 50/50)
RF power: 170 W
Substrate temperature: 680 degrees Celsius The formed $[(Na, Bi)_{1-x}Ba_x]TiO_3$ crystal piezoelectric film 15 was subjected to an X-ray diffraction analysis to analyze the crystal structure thereof.

(Method for Measurement of an a-Axis Length)

Figure 3A:
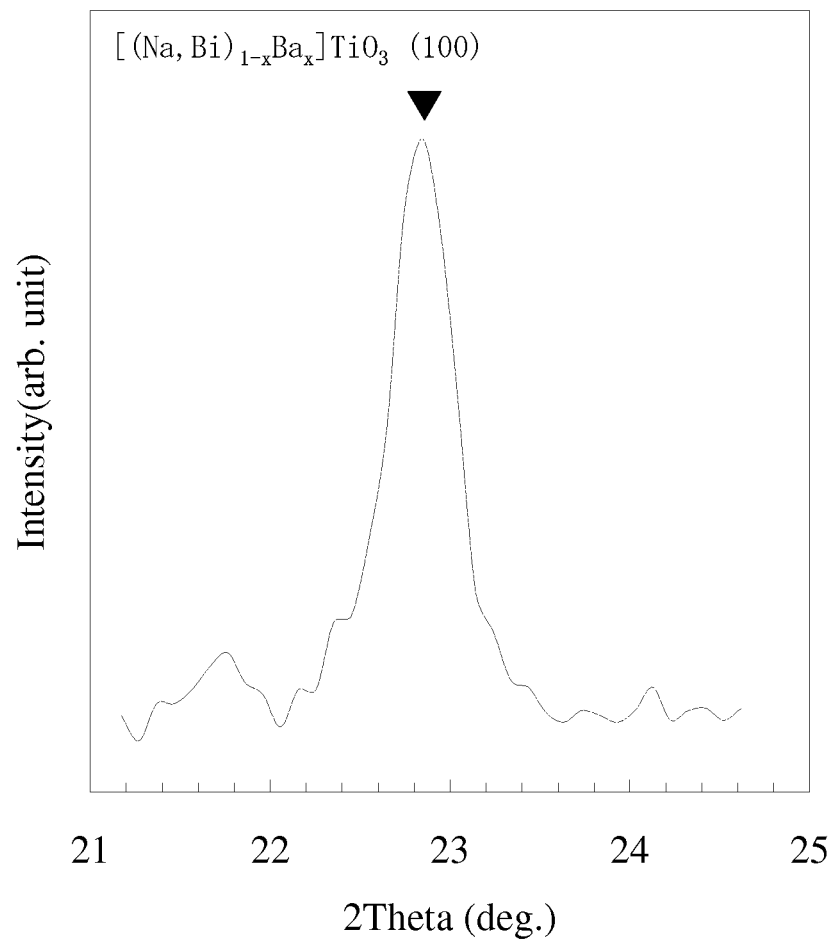
FIG. 3A shows a (100) surface X-ray diffraction spectrum of the $[(Na, Bi)_{1-x}Ba_x]TiO_3$ layer obtained in the example 1.

The $[(Na, Bi)_{1-x}Ba_x]TiO_3$ crystal piezoelectric film 15 was irradiated with an X-ray incident from the lateral side of the $[(Na, Bi)_{1-x}Ba_x]TiO_3$ crystal piezoelectric film 15, namely, along a [100] direction or a [010] direction, using an X-ray diffraction device (available from Spectris Co, Ltd. Trade name: X'Pert PRO MRD). In this way, obtained was the X-ray diffraction spectrum of the (100) surface of the $[(Na, Bi)_{1-x}Ba_x]TiO_3$ crystal piezoelectric film 15. FIG. 3A shows the obtained (100) surface X-ray diffraction spectrum.

The lattice spacing d of the (100) surface was calculated from the value of 2θ of the X-ray diffraction spectrum of the (100) surface on the basis of the following mathematical formula (I). The value of λ represents a wavelength of the used X-ray. In the example 1, the value of λ was 0.15406 nanometers. The mathematical formula (I) means Bragg's law.

$$2d \cdot \sin \theta = \lambda \qquad (I)$$

Next, the a-axis length was calculated from the obtained lattice spacing d on the (100) surface and the plane indices (h=1, k=0, l=0, in a case of a (100) surface) on the basis of the following mathematical formula (II).

$$1/d^2 = (h^2+k^2)/a^2 + l^2/c^2 \qquad (II)$$

where the value of a represents an a-axis length and the value of c represents an c-axis length.

Since h=1, k=0, and l=0, the following mathematical formula (IIa) is derived from the mathematical formula (II).

$$1/d^2 = 1/a^2 \qquad (IIa)$$

Since it is clear that the values of d and a are positive numbers, the formula a=d is satisfied. Therefore, the lattice spacing d of the (100) surface was the a-axis length.

(Method for Measurement of a c-Axis Length)

Figure 3B:
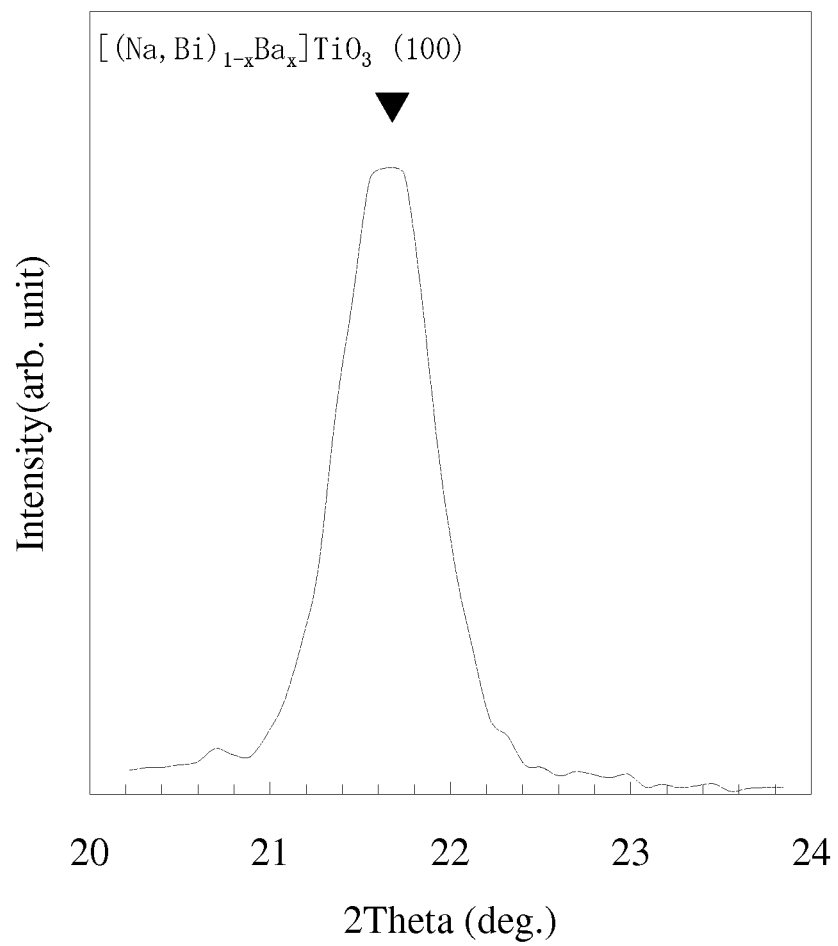
FIG. 3B shows a (001) surface X-ray diffraction spectrum of the $[(Na, Bi)_{1-x}Ba_x]TiO_3$ layer obtained in the example 1.

The $[(Na, Bi)_{1-x}Ba_x]TiO_3$ crystal piezoelectric film 15 was irradiated with an X-ray incident from the upper surface of the $[(Na, Bi)_{1-x}Ba_x]TiO_3$ crystal piezoelectric film 15, namely, along a [001] direction, with the X-ray diffraction device. In this way, obtained was the X-ray diffraction spectrum of the (001) surface of the $[(Na, Bi)_{1-x}Ba_x]TiO_3$ crystal piezoelectric film 15. FIG. 3B shows the obtained (001) surface X-ray diffraction spectrum.

Similarly to the case of the a-axis length, the lattice spacing d of the (001) surface was calculated from the value of 2θ of the X-ray diffraction spectrum of the (001) surface on the basis of the mathematical formula (I). Next, the c-axis length was calculated from the obtained lattice spacing d of the (001) surface and the plane indices (h=0, k=0, l=1, in a case of a (001) surface) on the basis of the mathematical formula (II). The lattice spacing d of the (001) surface was the c-axis length.

Next, a gold layer having a thickness of 100 nanometers was formed by vapor deposition on the surface of the $[(Na, Bi)_{1-x}Ba_x]TiO_3$ crystal piezoelectric film 15. The gold layer corresponds to the conductor layer 17. Thus, the piezoelectric film according to the example A1 was fabricated.

By using the platinum layer and the gold layer as electrodes, the ferroelectric performance and the piezoelectric performance of the $[(Na, Bi)_{1-x}Ba_x]TiO_3$ crystal piezoelectric film 15 were evaluated.

The polarization-disappearance temperature Td of the $[(Na, Bi)_{1-x}Ba_x]TiO_3$ crystal piezoelectric film 15 was measured pursuant to the disclosure of Journal of the American Ceramic Society 93 [4] (2010) 1108-1113.

The polarization-disappearance temperature Td of the $[(Na, Bi)_{1-x}Ba_x]TiO_3$ crystal piezoelectric film 15 according to the example A1 was a high value of 450 degrees Celsius. This means that the piezoelectric performance of the $[(Na, Bi)_{1-x}Ba_x]TiO_3$ crystal piezoelectric film 15 was maintained under a solder reflow temperature of 180 degrees Celsius.

The piezoelectric performance of the $[(Na, Bi)_{1-x}Ba_x]TiO_3$ crystal piezoelectric film 15 was evaluated in the following manner. The $[(Na, Bi)_{1-x}Ba_x]TiO_3$ crystal piezoelectric film 15 was cut into a strip having a width of 2 millimeters and worked into a cantilever shape. A potential difference was then applied between the platinum layer and the gold layer, so that an electric field generated between the two layers provides a displacement of the cantilever. The resulting displacement of the cantilever was measured using a laser displacement meter.

Then, the measured displacement amount was converted into the piezoelectric constant $d_{31}$. The piezoelectric constant $d_{31}$ (0.3 volts micrometer) of the $[(Na, Bi)_{1-x}Ba_x]TiO_3$ crystal piezoelectric film 15 according to the example A1 was −82 pC/N, when a low electric field of 0.3 volts/micrometer) was applied.

When a high electric field of 1.8 volts/micrometer was applied, the piezoelectric constant $d_{31}$ (1.8 volts/micrometer) of the $[(Na, Bi)_{1-x}Ba_x]TiO_3$ crystal piezoelectric film 15 according to the example A1 was −82 pC/N.

The linearity of the $[(Na, Bi)_{1-x}Ba_x]TiO_3$ crystal piezoelectric film 15 according to the example A1 was estimated on the basis of the ratio of the piezoelectric constant d31 (0.3 volts/micrometer) to the piezoelectric constant $d_{31}$ (1.8 volts/micrometer). In the example A1, this ratio was 1.00. This means that the amount of the displacement was proportional to the applied electric field.

Example A2

The $[(Na, Bi)_{1-x}Ba_x]TiO_3$ crystal piezoelectric film 15 was fabricated similarly to the one according to the example A1, except that the $La_{1+y}Ni_{1-y}O_3$ layer 13 was formed under the condition where the substrate temperature was 275 degrees Celsius.

Example A3

The $[(Na, Bi)_{1-x}Ba_x]TiO_3$ crystal piezoelectric film 15 was fabricated similarly to the one according to the example A1, except that the $La_{1+y}Ni_{1-y}O_3$ layer 13 was formed under the condition where the substrate temperature was 225 degrees Celsius.

Example A4

The $[(Na, Bi)_{1-x}Ba_x]TiO_3$ crystal piezoelectric film 15 was fabricated similarly to the one according to the example A1, except that y=0.00.

Example A5

The $[(Na, Bi)_{1-x}Ba_x]TiO_3$ crystal piezoelectric film 15 was fabricated similarly to the one according to the example A1, except that y=0.10.

Example A6

The $[(Na, Bi)_{1-x}Ba_x]TiO_3$ crystal piezoelectric film 15 was fabricated similarly to the one according to the example A1, except that y=0.00 and that the $La_{1+y}Ni_{1-y}O_3$ layer 13 was formed under the condition where the substrate temperature was 275 degrees Celsius.

Example A7

The $[(Na, Bi)_{1-x}Ba_x]TiO_3$ crystal piezoelectric film 15 was fabricated similarly to the one according to the example A1, except that y=0.00 and that the $La_{1+y}Ni_{1-y}O_3$ layer 13 was formed under the condition where the substrate temperature was 225 degrees Celsius.

Example A8

The $[(Na, Bi)_{1-x}Ba_x]TiO_3$ crystal piezoelectric film 15 was fabricated similarly to the one according to the example A1, except that y=0.10 and that the $La_{1+y}Ni_{1-y}O_3$ layer 13 was formed under the condition where the substrate temperature was 275 degrees Celsius.

Example A9

The $[(Na, Bi)_{1-x}Ba_x]TiO_3$ crystal piezoelectric film 15 was fabricated similarly to the one according to the example A1, except that y=0.10 and that the $La_{1+y}Ni_{1-y}O_3$ layer 13 was formed under the condition where the substrate temperature was 225 degrees Celsius.

Example A10

The $[(Na, Bi)_{1-x}Ba_x]TiO_3$ crystal piezoelectric film 15 was fabricated similarly to the one according to the example A1, except that x=0.02.

Example A11

The $[(Na, Bi)_{1-x}Ba_x]TiO_3$ crystal piezoelectric film 15 was fabricated similarly to the one according to the example A1, except that x=0.20.

Example A12

The $[(Na, Bi)_{1-x}Ba_x]TiO_3$ crystal piezoelectric film 15 was fabricated similarly to the one according to the example A1, except that y=0.05 and that the $[(Na,Bi)_{1-x}Ba_x]TiO_3$ crystal piezoelectric film 15 was formed under the condition where the RF power was 180W and where the $Ar/O_2$ flow ratio was 60/40.

The piezoelectric film according to the example A12 had the same a-axis length and c-axis length as the piezoelectric film according to the example A1. For this reason, the piezoelectric film according to the example A12 exhibited the same properties as the piezoelectric film according to the example A1. This means that the properties of the piezoelectric film depends on the a-axis length and the c-axis length only, regardless of the fabrication method of the piezoelectric film

Example A13

The piezoelectric stacking structture according to the example A13 was fabricated as below.

A Pt layer having a (100) orientation and a thickness of 250 nanometers was formed on an $MgAl_2O_4$ monocrystalline substrate having a (100) orientation only by an RF magnetron sputtering. The sputtering condition of this Pt layer was same as the one of the Pt layer formed in the example A1.

Then, the $[(Na, Bi)_{0.93}Ba_{0.07}]TiO_3$ crystal piezoelectric film 15 was formed on the Pt layer by an RF magnetron sputtering. The condition of the sputtering is described below.

Target $(Na,Bi)_{1-x}TiO_3$—$Ba_xTiO_3$ (x=0.07)
Atmosphere: Gaseous mixture of argon and oxygen (Flow ratio of $Ar/O_2$: 60/40)
RF power: 150 W
Substrate temperature: 680 degrees Celsius Similarly to the case of the example A12, the piezoelectric film according to the example A13 had the same a-axis length and c-axis length as the piezoelectric film according to the example A1. For this reason, the piezoelectric film according to the example A13 exhibited the same properties as the piezoelectric film according to the example A1. This means that the properties of the piezoelectric film depend on the a-axis length and the c-axis length only, regardless of the fabrication method of the piezoelectric film.

Example B1

The $[(Na, Bi)_{1-x}Ba_x]TiO_3$ crystal piezoelectric film 15 was fabricated similarly to the one according to the example A1, except that the $La_{1+y}Ni_{1-y}O_3$ layer 13 was formed under the condition where the substrate temperature was 200 degrees Celsius.

Example B2

The $[(Na, Bi)_{1-x}Ba_x]TiO_3$ crystal piezoelectric film 15 was fabricated similarly to the one according to the example A1, except that y=−0.05.

Example B3

The $[(Na, Bi)_{1-x}Ba_x]TiO_3$ crystal piezoelectric film 15 was fabricated similarly to the one according to the example A1, except that y=0.15.

Example B4

The $[(Na, Bi)_{1-x}Ba_x]TiO_3$ crystal piezoelectric film 15 was fabricated similarly to the one according to the example A1, except that x=0.00.

Example B5

The $[(Na, Bi)_{1-x}Ba_x]TiO_3$ crystal piezoelectric film 15 was fabricated similarly to the one according to the example A1, except that x=0.22.

Comparative Example 1

The $[(Na, Bi)_{1-x}Ba_x]TiO_3$ crystal piezoelectric film 15 was fabricated similarly to the one according to the example A1, except that the $La_{1+y}Ni_{1-y}O_3$ layer 13 was formed under the condition where the substrate temperature was 300 degrees Celsius.

The $[(Na, Bi)_{1-x}Ba_x]TiO_3$ crystal piezoelectric film 15 according to the comparative example 1 had a low polarization-disappearance temperature Td of 160 degrees Celsius. In the comparative example 1, the deformation amount was not proportional to the applied electric field. Note that the ratio of the piezoelectric constant d31 (0.3 volts/micrometer) to the piezoelectric constant d31 (1.8 volts/micrometer) was 0.76. The closer to one this ratio is, the closer to the accurate proportional relation the relation between the deformation amount and the applied electric field is.

Comparative Example 2

In accordance with U.S. Pat. No. 8,393,719, the $[(Na, Bi)_{1-x}Ba_x]TiO_3$ crystal piezoelectric film 15 was fabricated similarly to the one according to the example A1, except that an $Na_zLa_{1-z}NiO_3$ layer (z=0.07) was used instead of the $La_{1+y}Ni_{1-y}O_3$ layer 13, and that the $[(Na, Bi)_{1-x}Ba_x]TiO_3$ crystal piezoelectric film 15 was formed under the condition where the substrate temperature was 650 degrees Celsius. The $Na_zLa_{1-z}NiO_3$ layer (z=0.07) was formed under a temperature of 300 degrees Celsius.

Comparative Example 3

In accordance with US Pre-Grant Patent Application Publication No. 20130038666A1, the $[(Na, Bi)_{1-x}Ba_x]TiO_3$ crystal piezoelectric film 15 was fabricated similarly to the one according to the example A13, except that a (001) MgO substrate having a (111) Pt layer on the surface thereof was used instead of the silicon substrate, and that the $[(Na, Bi)_{0.93}Ba_{0.07}]TiO_3$ crystal piezoelectric film 15 was formed under the following condition.

Atmosphere: Gaseous mixture of argon and oxygen (Flow ratio of $Ar/O_2$: 50/50)
RF power: 170 W
Substrate temperature: 650 degrees Celsius Table 1 shows the results of the examples A1 to A13, the examples B1 to B5, and the comparative examples 1 to 3. Table 2 and Table 3 show the difference from the example A1.

TABLE 1

|  | x | a-axis length (nm) | c-axis length (nm) | d31 (0.3 V/μm) (pm/V) | d31 (1.8 V/μm) (pm/V) | d31 (0.3 V/μm)/ d31 (1.8 V/μm) | Td |
|---|---|---|---|---|---|---|---|
| Example A1 | 0.07 | 0.392 | 0.410 | −82 | −82 | 1 | 450 |
| Example A2 | 0.07 | 0.392 | 0.399 | −80 | −82 | 0.98 | 410 |
| Example A3 | 0.07 | 0.392 | 0.420 | −79 | −79 | 1 | 470 |
| Example A4 | 0.07 | 0.391 | 0.410 | −80 | −80 | 1 | 455 |
| Example A5 | 0.07 | 0.394 | 0.410 | −81 | −81 | 1 | 446 |
| Example A6 | 0.07 | 0.391 | 0.399 | −80 | −81 | 0.99 | 422 |
| Example A7 | 0.07 | 0.391 | 0.420 | −79 | −79 | 1 | 475 |

TABLE 1-continued

| | x | a-axis length (nm) | c-axis length (nm) | d31 (0.3 V/μm) (pm/V) | d31 (1.8 V/μm) (pm/V) | d31 (0.3 V/μm)/ d31 (1.8 V/μm) | Td |
|---|---|---|---|---|---|---|---|
| Example A8 | 0.07 | 0.394 | 0.399 | −79 | −80 | 0.99 | 389 |
| Example A9 | 0.07 | 0.394 | 0.420 | −78 | −78 | 1 | 466 |
| Example A10 | 0.02 | 0.392 | 0.410 | −80 | −80 | 1 | 440 |
| Example A11 | 0.20 | 0.392 | 0.410 | −81 | −81 | 1 | 463 |
| Example A12 | 0.07 | 0.392 | 0.410 | −82 | −82 | 1 | 448 |
| Example A13 | 0.07 | 0.392 | 0.410 | −95 | −95 | 1 | 455 |
| Example B1 | 0.07 | 0.392 | 0.423 | −38 | −38 | 1 | 460 |
| Example B2 | 0.07 | 0.390 | 0.410 | −32 | −32 | 1 | 440 |
| Example B3 | 0.07 | 0.395 | 0.410 | −36 | −45 | 0.8 | 420 |
| Example B4 | 0 | 0.392 | 0.410 | −20 | −27 | 0.74 | 400 |
| Example B5 | 0.22 | 0.392 | 0.410 | −35 | −44 | 0.8 | 456 |
| Comparative example 1 | 0.07 | 0.392 | 0.396 | −28 | −37 | 0.76 | 160 |
| Comparative example 2 | 0.07 | 0.392 | 0.395 | −32 | −45 | 0.71 | 156 |
| Comparative example 3 | 0.07 | 0.389 | 0.396 | −90 | −120 | 0.75 | 158 |

TABLE 2

| | Difference from the example A1 |
|---|---|
| Example A1 | — |
| Example A2 | The $La_{1+y}Ni_{1-y}O_3$ layer 13 was formed under a temperature of 275° C. |
| Example A3 | The $La_{1+y}Ni_{1-y}O_3$ layer 13 was formed under a temperature of 225° C. |
| Example A4 | y = 0.00 |
| Example A5 | y = 0.10 |
| Example A6 | The $La_{1+y}Ni_{1-y}O_3$ layer 13 was formed under a temperature of 275° C. And y = 0.00. |
| Example A7 | The $La_{1+y}Ni_{1-y}O_3$ layer 13 was formed under a temperature of 225° C. And y = 0.00. |
| Example A8 | The $La_{1+y}Ni_{1-y}O_3$ layer 13 was formed under a temperature of 275° C. And y = 0.10. |
| Example A9 | The $La_{1+y}Ni_{1-y}O_3$ layer 13 was formed under a temperature of 225° C. And y = 0.10. |
| Example A10 | x = 0.02 |
| Example A11 | x = 0.20 |
| Example A12 | y = −0.05, the RF power, and the Ar/O2 flow ratio |
| Example A13 | $MgAl_2O_4$ monocrystalline substrate |

TABLE 3

| | |
|---|---|
| Example B1 | The $La_{1+y}Ni_{1-y}O_3$ layer 13 was formed under a temperature of 200° C. |
| Example B2 | y = −0.05 |
| Example B3 | y = 0.15 |
| Example B4 | x = 0.00 |
| Example B5 | x = 0.22 |
| Comparative example 1 | The $La_{1+y}Ni_{1-y}O_3$ layer 13 was formed under a temperature of 300° C. |
| Comparative example 2 | The $Na_zLa_{1-z}NiO_3$ layer 13 (z = 0.07) was used. |
| Comparative example 3 | MgO monocrystalline substrate |

As is clear from Table 1, the $[(Na, Bi)_{1-x}Ba_x]TiO_3$ crystal piezoelectric film 15 has a significantly high polarization-disappearance temperature Td of not less than 389 degrees Celsius, if an a-axis length is not less than 0.390 nanometers and not more than 0.395 nanometers and a c-axis length is not less than 0.399 nanometers and not more than 0.423 nanometers. In other words, the polarization of the $[(Na, Bi)_{1-x}Ba_x]TiO_3$ crystal piezoelectric film 15 does not disappear, even if such a $[(Na, Bi)_{1-x}Ba_x]TiO_3$ crystal piezoelectric film 15 is heated under a temperature less than 389 degrees Celsius.

As is clear from the comparative example 3, the polarization-disappearance temperature Td is low, if an a-axis length is less than 0.390 nanometers.

As is clear from the comparative examples 1-3, the polarization-disappearance temperature Td is low, if a c-axis length is less than 0.399 nanometers.

Desirably, an a-axis length is not less than 0.391 nanometers. As is clear from the example B2, an a-axis length less than 0.391 nanometers decreases the piezoelectric constant d31.

Desirably, an a-axis length is not more than 0.394 nanometers. As is clear from the example B3, an a-axis length more than 0.394 nanometers decreases the piezoelectric constant d31 and the linearity.

Desirably, a c-axis length is not more than 0.420 nanometers. As is clear from the example B1, a c-axis length more than 0.420 nanometers decreases the piezoelectric constant d31.

Desirably, the value of x is more than 0.00 and not more than 0.20. As is clear from the example B4, if x is 0.00, the piezoelectric constant d31 and the linearity are decreased. Similarly, as is clear from the example B5, if x is more than 0.20, the piezoelectric constant d31 and the linearity are decreased.

INDUSTRIAL APPLICABILITY

The $[(Na, Bi)_{1-x}Ba_x]TiO_3$ crystal piezoelectric film according to the present invention can be used for an ink-jet head, an angular velocity sensor, and a piezoelectric generating element.

Hereinafter, the ink jet head, the angular velocity sensor, and the piezoelectric generating element according to the present invention each comprising the above-mentioned $[(Na, Bi)_{1-x}Ba_x]TiO_3$ crystal piezoelectric film (hereinafter, referred to as the "piezoelectric film") are described. For more detail, see WO2010047049. U.S. Pat. No. 7,870,787 and Chinese Laid-open Patent application publication No. 101981718 are the United States patent publication and the Chinese laid-open patent application publication which corresponds to WO2010047049, respectively.

[Ink Jet Head]

An ink jet head of the present invention will be described below with reference to FIG. 6 to FIG. 8.

Figure 6:
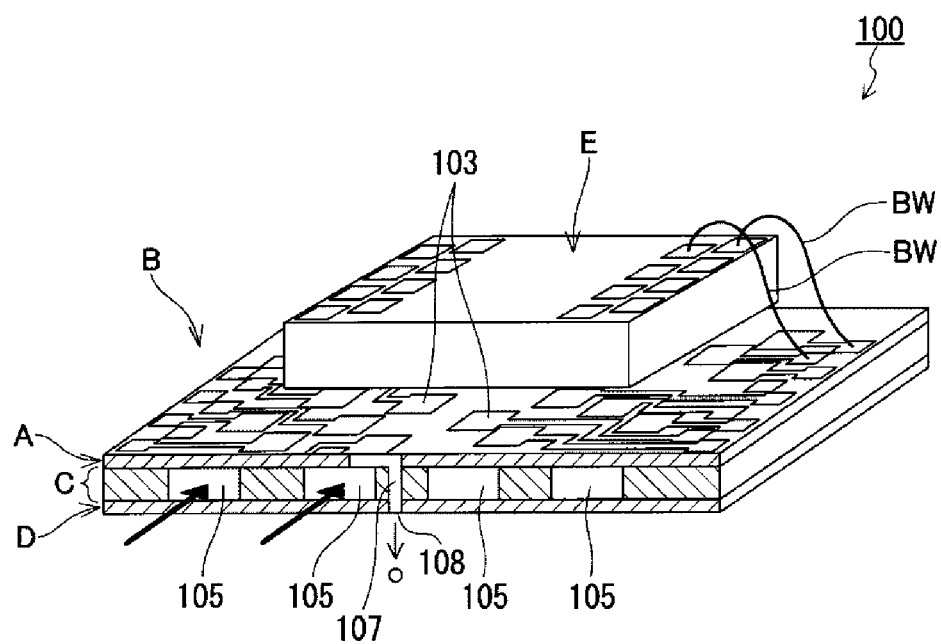
FIG. 6 is a perspective view schematically showing an example of an ink jet head of the present invention and partially showing a cross section of the ink jet head.

FIG. 6 shows one embodiment of the ink jet head of the present invention. FIG. 7 is an exploded view showing main parts including a pressure chamber member and an actuator part in an ink jet head 100 shown in FIG. 6.

Figure 7:
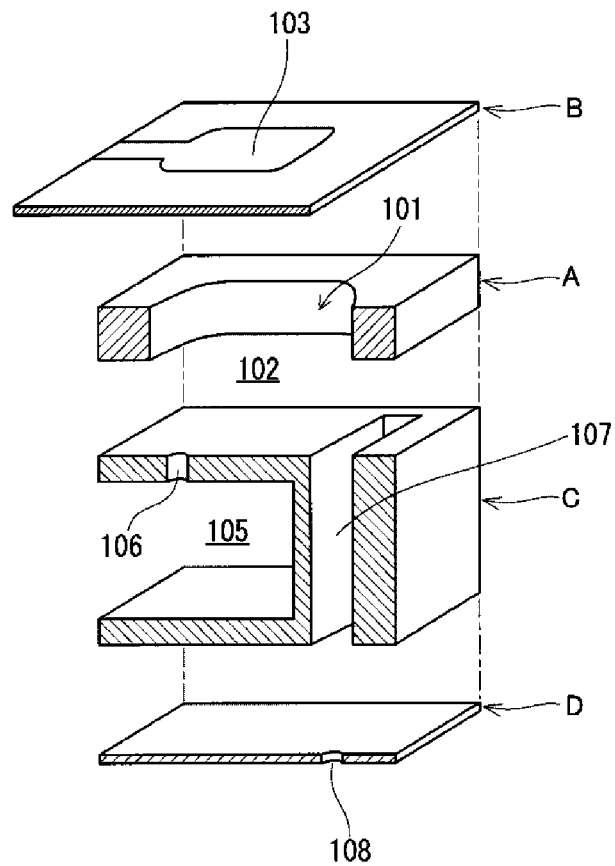
FIG. 7 is an exploded perspective view schematically showing main parts including a pressure chamber member and an actuator part in the ink jet head shown in FIG. 6 and partially showing a cross section of the main parts.

A reference character A in FIG. 6 and FIG. 7 indicates a pressure chamber member. The pressure chamber member A includes through-holes 101 that penetrate therethrough in its thickness direction (in the upward and downward directions in these diagrams). The through-hole 101 shown in FIG. 7 is a part of the through-hole 101 in the cross section in the thickness direction of the pressure chamber member A. A reference character B indicates an actuator part including piezoelectric films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric films and vibration layers that are aligned over the corresponding pressure chambers 102 respectively in plan view. In FIG. 6 and FIG. 7, a reference numeral 103 indicates an individual electrode layer that is a part of the piezoelectric film. As shown in FIG. 6, in the ink jet head 100, a plurality of individual electrode layers 103, that is, piezoelectric films are arranged in a zigzag pattern in plan view.

The ink passage member C has the common liquid chambers 105 arranged in stripes in plan view. In FIG. 6 and FIG. 7, each of the common liquid chambers 105 is aligned over a plurality of pressure chambers 102 in plan view. The common liquid chambers 105 extend in the ink supply direction (in the direction indicated by arrows in FIG. 6) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 6, a reference character E indicates an IC chip. The IC chip E is connected electrically to the individual electrode layers 103, which are exposed on the surface of the actuator part B, through bonding wires BW. For simplicity of FIG. 6, only a part of the bonding wires BW are shown in FIG. 6.

FIG. 7 shows the configuration of the main parts including the pressure chamber member A and the actuator part B. FIG. 8 shows the cross section perpendicular to the ink supply direction (in the direction indicated by the arrows in FIG. 6) in the pressure chamber member A and the actuator part B. The actuator part B includes piezoelectric films 104 (104a to 104d) each having the piezoelectric layer 15 sandwiched between the first electrode (the individual electrode layer 103) and the second electrode (the common electrode layer 112). The individual electrode layers 103 correspond one to one to the piezoelectric films 104a to 104d. The common electrode layer 112 is a single layer electrode that is common to the piezoelectric films 104a to 104d.

Figure 8:
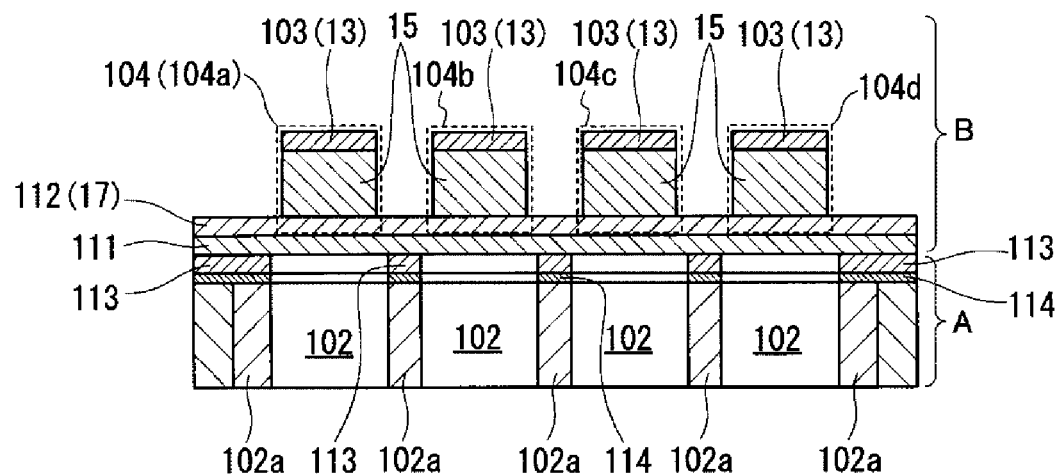
FIG. 8 is a cross-sectional view schematically showing an example of the main parts including the pressure chamber member and the actuator part in the ink jet head shown in FIG. 6.

As surrounded by the dashed-line in FIG. 8, the above-mentioned piezoelectric films 104 are arranged in the ink jet head.

[Image Forming Method by Ink Jet Head]

The image forming method of the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character. In other words, according to the present method for forming an image, a letter, a picture, or a figure is printed to a print target such as a sheet of paper. With this method, a picturesque image can be printed.

[Angular Velocity Sensor]

Figure 9:
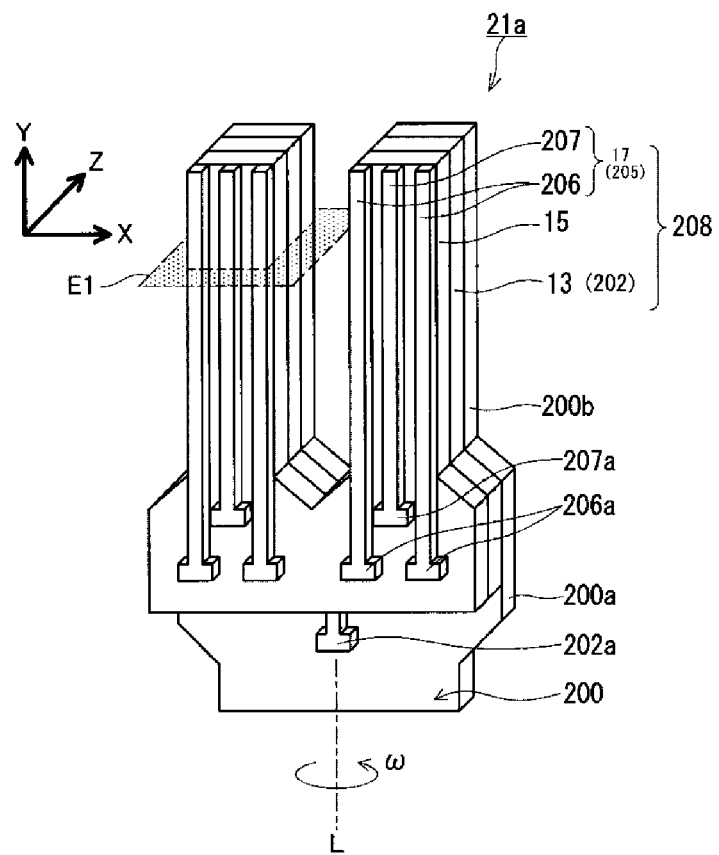
FIG. 9 is a perspective view schematically showing an example of an angular velocity sensor of the present invention.
Figure 10:
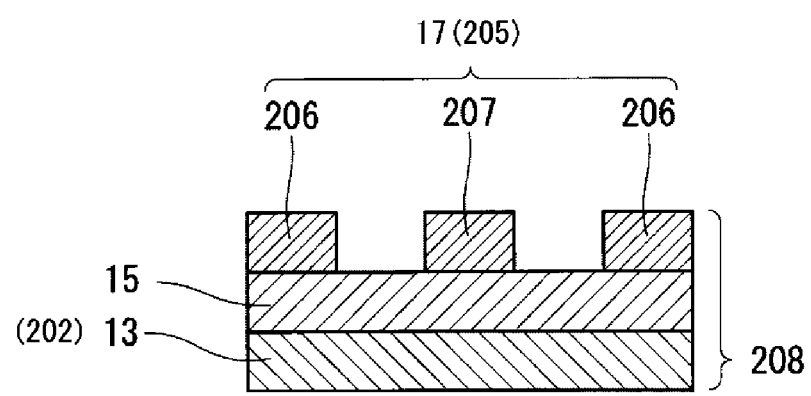
FIG. 10 is a cross-sectional view showing a cross section E1 of the angular velocity sensor shown in FIG. 9.

FIG. 9 shows examples of an angular velocity sensor of the present invention. FIG. 10 shows a cross section E1 of an angular velocity sensor 21a shown in FIG. 9. The angular velocity sensor 21a shown in FIG. 9 is a so-called tuning-fork type angular velocity sensor. This type of angular velocity sensor can be used in a navigation apparatus for a vehicle, and as a sensor for correcting image blurring due to hand movement in a digital still camera.

The angular velocity sensor 21a shown in FIG. 9 includes a substrate 200 having vibration parts 200b and piezoelectric films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. Particularly, it is the Y direction in FIG. 8. The substrate 200 has a shape of a tuning fork including two arms (vibration parts 200b), when viewed from the thickness direction of the substrate 200 (the Z direction in FIG. 8).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensor 21a can develop. More particularly, the substrate 200 has a thickness of at least 0.1 mm but not more than 0.8 mm. The thickness of the stationary part 200a can be different from that of the vibration part 200b.

The piezoelectric film 208 is bonded to the vibration part 200b. The piezoelectric film 208 is the piezoelectric layer described in the item titled as "Piezoelectric film". As shown in FIG. 9 and FIG. 10, the piezoelectric film 208 comprises the first electrode 13 (202), the piezoelectric layer 15, and the second electric layer 17 (205).

The second electrode 205 has an electrode group including a drive electrode 206 and a sense electrode 207. The drive electrode 206 applies a driving voltage that oscillates the vibration part 200*b* to the piezoelectric layer 15. The sense electrode 207 measures a deformation of the vibration part 200*b* caused by an angular velocity applied to the vibration part 200*b*. That is, the vibration part 200*b* usually oscillates in the width direction thereof (the X direction in FIG. 9). More particularly, in the angular velocity sensor shown in FIG. 9, a pair of drive electrodes 206 are provided on both of the width-direction edge portions of the vibration part 200*b* along the length direction thereof (the Y direction in FIG. 9). Only one drive electrode 206 may be provided on one of the width-direction edge portions of the vibration part 200*b*. In the angular velocity sensor shown in FIG. 9, the sense electrode 207 is provided along the length direction of the vibration part 200*b* and sandwiched between the pair of drive electrodes 206. A plurality of sense electrodes 207 may be provided on the vibration part 200*b*. The deformation of the vibration part 200*b* measured by the sense electrode 207 usually is a deflection in the thickness direction thereof (the Z direction in FIG. 9).

In the angular velocity sensor of the present invention, one of the first electrode and the second electrode selected therefrom can be composed of an electrode group including the drive electrode and the sense electrode. In the angular velocity sensor 21*a* shown in FIG. 9, the second electrode 205 is composed of the electrode group. Unlike this angular velocity sensor, the first electrode 202 can be composed of the electrode group.

The first electrode 202, the drive electrode 206, and the sense electrode 207 have connection terminals 202*a*, 206*a*, and 207*a*, respectively, formed at the end portions thereof. The shape and position of each of the connection terminals are not limited. In FIG. 9, the connection terminals are provided on the stationary part 200*a*.

In the angular velocity sensor shown in FIG. 9, the piezoelectric film 208 is bonded to both the vibration part 200*b* and the stationary part 200*a*. The bonding state of the piezoelectric film 208 is not limited as long as the piezoelectric film 208 can oscillate the vibration part 200*b* and measure the deformation of the vibration part 200*b*. For example, the piezoelectric film 208 may be bonded only to the vibration part 200*b*.

The angular velocity sensor of the present invention may have two or more vibration part groups each consisting of a pair of vibration parts 200*b*. Such an angular velocity sensor can serve as a biaxial or triaxial angular velocity sensor capable of measuring angular velocities with respect to a plurality central axes of rotation. The angular velocity sensor shown in FIG. 9 has one vibration part group consisting of a pair of vibration parts 200*b*.

[Method of Measuring Angular Velocity by Angular Velocity Sensor]

The angular velocity measuring method of the present invention uses the angular velocity sensor of the present invention, and includes the steps of: applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensor 21*a* shown in FIG. 9 is described. A driving voltage having a frequency that resonates with the natural vibration of the vibration part 200*b* is applied to the piezoelectric layer 15 through the first electrode 202 and the drive electrode 206 so as to oscillate the vibration part 200*b*. The driving voltage can be applied, for example, by grounding the first electrode 202 and changing the potential of the driving electrode 206 (in other words, the driving voltage is the potential difference between the first electrode 202 and the driving electrode 206). The angular velocity sensor 21*a* includes a pair of vibration parts 200*b* that are arranged in the form of the tuning fork. Usually, reverse (positive and negative) voltages are applied to the drive electrodes 206 provided on the respective vibration parts 200*b* of the pair. This allows the respective vibration parts 200*b* to oscillate in the mode in which they vibrate in the directions opposite to each other (the mode in which they vibrate symmetrically with respect to the central axis of rotation L shown in FIG. 9). In the angular velocity sensors 21*a* shown in FIG. 9, the vibration parts 200*b* oscillate in their width direction (the X direction). The angular velocity can be measured by oscillating only one of the pair of vibration parts 200*b*. For accurate measurement, however, it is preferable to oscillate both of the vibration parts 200*b* in the mode in which they vibrate in the directions opposite to each other.

When an angular velocity ω with respect to the central axis of rotation L is applied to the angular velocity sensor 21*a* in which the vibration parts 200*b* are oscillating, the vibration parts 200*b* are deflected respectively in their thickness direction (the Z direction) by Coriolis force. In the case where the respective vibration parts 200*b* are oscillating in the opposite direction mode, they are deflected in the opposite directions by the same degree. The piezoelectric layer 15 bonded to the vibration part 200*b* is also deflected according to this deflection of the vibration part 200*b*. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21*a* can be measured by measuring the magnitude of the potential difference.

The following relationship between a Coriolis force Fc and an angular velocity ω is true:

$$Fc = 2mv\omega$$

where v is the velocity of the oscillating vibration part 200*b* in the oscillation direction, and m is the mass of the vibration part 200*b*. As shown in this equation, the angular velocity ω can be calculated from the Coriolis force Fc.

[Piezoelectric Generating Element]

Figure 11:
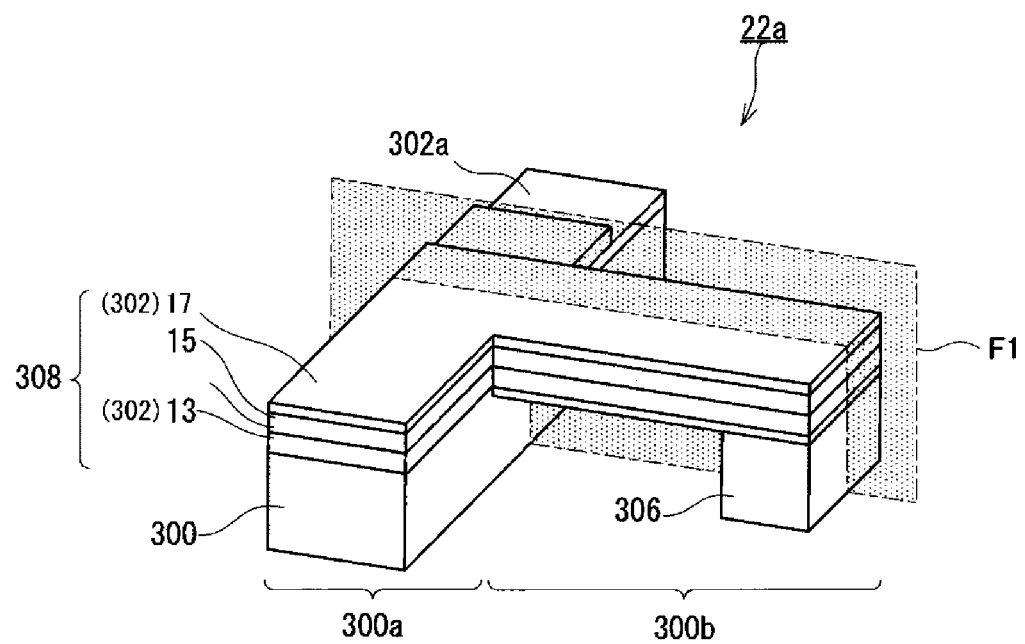
FIG. 11 is a perspective view schematically showing an example of a piezoelectric generating element of the present invention.
Figure 12:
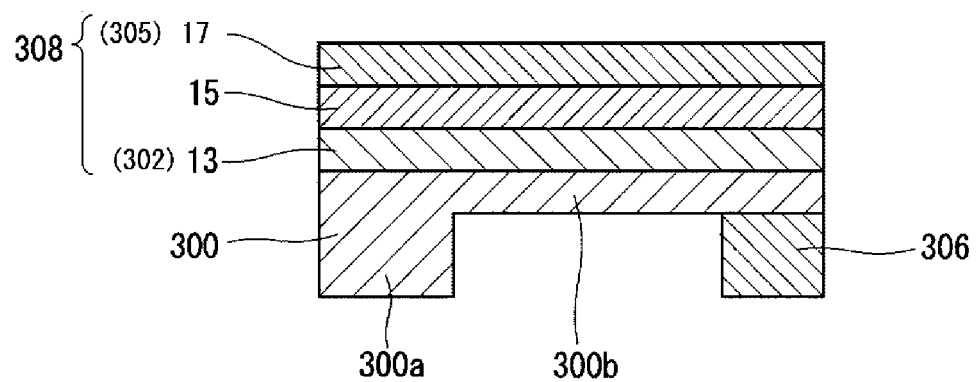
FIG. 12 is a cross-sectional view showing a cross section F1 of the piezoelectric generating element shown in FIG. 11.

FIG. 11 shows an example of the piezoelectric generating element of the present invention. FIG. 12 shows a cross section F1 of a piezoelectric generating element 22*a* shown in FIG. 11. The piezoelectric generating elements 22*a* are elements that convert externally-applied mechanical vibration into electrical energy. The piezoelectric generating elements 22*a* are applied suitably to a self-sustained power supply for generating electric power from various vibrations including engine vibrations and driving vibrations generated in vehicles and machines, and vibrations generated during walking.

The piezoelectric generating element 22*a* shown in FIG. 11 includes a substrate 300 having a vibration part 300*b* and a piezoelectric film 308 bonded to the vibration part 300*b*.

The substrate 300 has a stationary part 300a, and a vibration part 300b having a beam extending in a predetermined direction from the stationary part 300a. The material of the stationary part 300a can be the same as the material of the vibration part 300b. These materials may, however, be different from each other. The stationary part 300a and the vibration part 300b made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is bonded to the vibration part 300b. The weight load 306 adjusts the resonance frequency of the vibration part 300b. The weight load 306 is, for example, a vapor-deposited thin film of Ni. The material, shape, and mass of the weight load 306, as well as the position to which the weight load 306 is bonded can be adjusted according to a desired resonance frequency of the vibration part 300b. The weight load 306 may be omitted. The weight load 306 is not necessary when the resonance frequency of the vibration part 300b is not adjusted.

The piezoelectric film 308 is bonded to the vibration part 300b. The piezoelectric film 308 is the piezoelectric layer described in the item titled as "Piezoelectric film". As shown in FIG. 11 and FIG. 12, the piezoelectric film 308 comprises the first electrode 13 (302), the piezoelectric layer 15, the second electrode 17 (305).

In the piezoelectric generating elements shown in FIG. 11, a part of the first electrode 302 is exposed. This part can serve as a connection terminal 302a.

In the piezoelectric generating element shown in FIG. 11, the piezoelectric film 308 can be bonded to both of the vibration part 300b and the stationary part 300a. The piezoelectric film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

[Method of Generating Electric Power Using Piezoelectric Generating Element]

The above-described piezoelectric generating element of the present invention is vibrated to obtain electric power through the first electrode and the second electrode.

When mechanical vibration is applied externally to the piezoelectric generating element 22a, the vibration part 300b starts vibrating to produce vertical deflection with respect to the stationary part 300a. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

REFERENTIAL SIGNS LIST

11: substrate
12: metal electrode layer
13: $La_{1+y}Ni_{1-y}O_3$ layer
15: $[(Na, Bi)_{1-x}Ba_x]TiO_3$ crystals piezoelectric film
17: conductive layer

The invention claimed is:

1. A $[(Na,Bi)_{1-x}Ba_x]TiO_3$ crystal piezoelectric film, wherein
   the $[(Na,Bi)_{1-x}Ba_x]TiO_3$ crystal piezoelectric film has a (001) orientation only;
   the $[(Na,Bi)_{1-x}Ba_x]TiO_3$ crystal piezoelectric film has an a-axis length of not less than 0.390 nanometers and not more than 0.395 nanometers;
   the $[(Na,Bi)_{1-x}Ba_x]TiO_3$ crystal piezoelectric film has a c-axis length of not less than 0.399 nanometers and not more than 0.423 nanometers;
   x represents a value of not less than 0 and not more than 1; and
   the $[(Na,Bi)_{1-x}Ba_x]TiO_3$ crystal piezoelectric film has a polarization-disappearance temperature of not less than 389 degrees Celsius.

2. The $[(Na,Bi)_{1-x}Ba_x]TiO_3$ crystal piezoelectric film according to claim 1, wherein
   the $[(Na,Bi)_{1-x}Ba_x]TiO_3$ crystal piezoelectric film has a polarization-disappearance temperature of not more than 470 degrees Celsius.

3. The $[(Na,Bi)_{1-x}Ba_x]TiO_3$ crystal piezoelectric film according to claim 1, further comprising manganese.

4. The $[(Na,Bi)_{1-x}Ba_x]TiO_3$ crystal piezoelectric film according to claim 1, wherein
   x is not less than 0.00 and not more than 0.22.

5. The $[(Na,Bi)_{1-x}Ba_x]TiO_3$ crystal piezoelectric film according to claim 1, wherein
   the $[(Na,Bi)_{1-x}Ba_x]TiO_3$ crystal piezoelectric film has an a-axis length of not less than 0.391 nanometers and not more than 0.394 nanometers;
   the $[(Na,Bi)_{1-x}Ba_x]TiO_3$ crystal piezoelectric film has a c-axis length of not less than 0.399 nanometers and not more than 0.420 nanometers; and
   x represents a value of not less than 0.02 and not more than 0.20.

6. The $[(Na,Bi)_{1-x}Ba_x]TiO_3$ crystal piezoelectric film according to claim 5, wherein
   the $[(Na,Bi)_{1-x}Ba_x]TiO_3$ crystal piezoelectric film has a piezoelectric constant d31 (0.3 volts/micrometer) which satisfies the following mathematical formula (I),
   the $[(Na,Bi)_{1-x}Ba_x]TiO_3$ crystal piezoelectric film has a piezoelectric constant d31 (1.8 volts/micrometer) which satisfies the following mathematical formula (II), and
   the $[(Na,Bi)_{1-x}Ba_x]TiO_3$ crystal piezoelectric film has a linearity which satisfies the following mathematical formula (III).

$$|\text{Piezoelectric constant } d31(0.3 \text{ volts/micrometer})| \leq 78 \quad \text{(I)}$$

$$|\text{Piezoelectric constant } d31(1.8 \text{ volts/micrometer})| \leq 78 \quad \text{(II)}$$

$$0.98 \leq (\text{Piezoelectric constant } d31(0.3 \text{ volts/micrometer})/\text{Piezoelectric constant } d31(1.8 \text{ volts/micrometer})) \leq 1.00 \quad \text{(III)}$$

7. A piezoelectric stacking structure comprising:
a $La_{1-y}Ni_{1-y}O_3$ layer; and
the $[(Na,Bi)_{1-x}Ba_x]TiO_3$ crystal piezoelectric film according to claim 1, wherein
the $[(Na,Bi)_{1-x}Ba_x]TiO_3$ crystal piezoelectric film is stacked on the $La_{1+y}Ni_{1-y}O_3$ layer in such a manner that the $[(Na,Bi)_{1-x}Ba_x]TiO_3$ crystal piezoelectric film is in contact with the $La_{1+y}Ni_{1-y}O_3$ layer; and
y represents a value of not less than −0.05 and not more than 0.15.

8. The piezoelectric stacking structure according to claim 7, wherein
y is not less than 0.00 and not more than 0.10.

9. An ink jet head comprising:
a piezoelectric film sandwiched between a first electrode and a second electrode;
a vibration layer bonded to the piezoelectric film; and
a pressure chamber member having a pressure chamber for storing ink and bonded to a surface of the vibration layer opposite to a surface to which the piezoelectric film is bonded, wherein
the vibration layer is bonded to the piezoelectric film so that the vibration layer is displaceable in its film thickness direction according to a displacement of the piezoelectric film based on a piezoelectric effect;
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber; and
the piezoelectric film is the $[(Na,Bi)_{1-x}Ba_x]TiO_3$ crystal piezoelectric film according to claim 1.

10. A method of forming an image with an ink jet head, the method comprising:
a step (a) of preparing the ink jet head, wherein
the ink jet head comprises: a piezoelectric film sandwiched between a first electrode and a second electrode; a vibration layer bonded to the piezoelectric film; and a pressure chamber member having a pressure chamber for storing ink and bonded to a surface of the vibration layer opposite to a surface to which the piezoelectric film is bonded,
the vibration layer is bonded to the piezoelectric film so that the vibration layer is displaceable in its film thickness direction according to a displacement of the piezoelectric film based on a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber, and
the piezoelectric film is the $[(Na,Bi)_{1-x}Ba_x]TiO_3$ crystal piezoelectric film according to claim 1,
a step (b) of applying a voltage to the piezoelectric film through the first electrode and the second electrode to displace, based on the piezoelectric effect, the vibration layer in its film thickness direction so that the volumetric capacity of the pressure chamber changes and eject the ink from the pressure chamber by the displacement.

11. An angular velocity sensor comprising:
a substrate having a vibration part; and
a piezoelectric film bonded to the vibration part and sandwiched between a first electrode and a second electrode, wherein
the piezoelectric film is a $[(Na,Bi)_{1-x}Ba_x]TiO_3$ crystal piezoelectric film according to claim 1, and
one of the first electrode and the second electrode selected therefrom is composed of an electrode group including a drive electrode for applying a driving voltage that oscillates the vibration part to the piezoelectric layer and a sense electrode for measuring a displacement of the vibration part caused by an angular velocity applied to the oscillating vibration part.

12. A method of measuring an angular velocity with an angular velocity sensor, the method comprising:
a step (a) of preparing the angular velocity sensor, wherein
the angular velocity sensor comprises: a substrate having a vibration part; and a piezoelectric film bonded to the vibration part and sandwiched between a first electrode and a second electrode,
the piezoelectric film is the $[(Na,Bi)_{1-x}Ba_x]TiO_3$ crystal piezoelectric film according to claim 1, and
one of the first electrode and the second electrode selected therefrom is composed of an electrode group including a drive electrode and a sense electrode;
a step (b) of applying a driving voltage to the piezoelectric film through the drive electrode and the other of the first electrode and the second electrode selected therefrom to oscillate the vibration part; and
a step (c) of measuring, through the other electrode and the sense electrode, a displacement of the vibration part caused by an angular velocity applied to the oscillating vibration part to obtain a value of the applied angular velocity.

13. A piezoelectric generating element comprising:
a substrate having a vibration part; and
a piezoelectric film bonded to the vibration part and sandwiched between a first electrode and a second electrode,
wherein
the piezoelectric film is the $[(Na,Bi)_{1-x}Ba_x]TiO_3$ crystal piezoelectric film according to claim 1.

14. A method of generating electric power using a piezoelectric generating element, the method comprising:
a step (a) of preparing the piezoelectric generating element, wherein
the piezoelectric generating element comprises: a substrate having a vibration part; and a piezoelectric film bonded to the vibration part and sandwiched between a first electrode and a second electrode,
the piezoelectric film is the $[(Na,Bi)_{1-x}Ba_x]TiO_3$ crystal piezoelectric film according to claim 1, and
a step (b) of vibrating the vibration part to obtain electric power through the first electrode and the second electrode.

* * * * *